(12) United States Patent
Hyun et al.

(10) Patent No.: US 9,223,514 B2
(45) Date of Patent: Dec. 29, 2015

(54) ERASE SUSPEND/RESUME FOR MEMORY

(71) Applicant: Fusion-io, Inc., Salt Lake City, UT (US)

(72) Inventors: Jea Woong Hyun, South Jordan, UT (US); David Nellans, Salt Lake City, UT (US)

(73) Assignee: SanDisk Technologies, Inc., Plano, TX (US)

( * ) Notice: Subject to any disclaimer, the term of this patent is extended or adjusted under 35 U.S.C. 154(b) by 0 days.

(21) Appl. No.: 13/800,628

(22) Filed: Mar. 13, 2013

(65) Prior Publication Data
US 2013/0198451 A1 Aug. 1, 2013

(51) Int. Cl.
| | |
|---|---|
| *G06F 3/06* | (2006.01) |
| *G11C 16/16* | (2006.01) |
| *G11C 16/22* | (2006.01) |
| *G06F 12/02* | (2006.01) |

(52) U.S. Cl.
CPC .............. *G06F 3/0652* (2013.01); *G11C 16/16* (2013.01); *G11C 16/225* (2013.01); *G06F 12/0246* (2013.01)

(58) Field of Classification Search
CPC ... G06F 3/0611; G06F 3/0659; G06F 3/0688; G06F 13/362; G06F 3/067; G06F 3/0652; G06F 9/4881; G11C 2216/20; G11C 11/5635; G11C 2216/22
See application file for complete search history.

(56) References Cited

U.S. PATENT DOCUMENTS

| | | | |
|---|---|---|---|
| 4,980,861 A | 12/1990 | Herdt et al. | |
| 5,193,184 A | 3/1993 | Belsan et al. | |
| 5,261,068 A | 11/1993 | Gaskins et al. | |
| 5,325,509 A | 6/1994 | Lautzenheiser | |
| 5,404,485 A | 4/1995 | Ban | |
| 5,438,671 A | 8/1995 | Miles | |
| 5,504,882 A | 4/1996 | Chai | |
| 5,535,399 A | 7/1996 | Blitz et al. | |

(Continued)

FOREIGN PATENT DOCUMENTS

| | | |
|---|---|---|
| CN | 1771495 | 5/2006 |
| EP | 0747822 | 12/1996 |

(Continued)

OTHER PUBLICATIONS

Shibata "19nm 112.8mm2 64Gb Multi-Level Flash Memory with 400mb/s/pin 1.8V Toggle Mode Interface" Flash Memory Summit, (2012), 30 pages.

(Continued)

*Primary Examiner* — Idriss N Alrobaye
*Assistant Examiner* — Ronald Modo
(74) *Attorney, Agent, or Firm* — Kunzler Law Group, PC

(57) ABSTRACT

An apparatus includes an input/output (I/O) interface configured to couple a controller to an I/O buffer of a memory device. The controller includes an erase module coupled to the I/O interface. The erase module is configured to issue an instruction to the memory device to erase data from the memory device. The controller includes an erase suspend module coupled to the I/O interface. The erase suspend module is configured to determine that an erase operation executing within the electronic memory device satisfies a suspend policy in response to receiving a memory access request to perform an operation on the memory device on which the erase operation is executing. The erase suspend module is further configured to issue a suspend command to the memory device to suspend the erase operation.

29 Claims, 5 Drawing Sheets

(56) References Cited

U.S. PATENT DOCUMENTS

| | | |
|---|---|---|
| 5,553,261 A | 9/1996 | Hasbun et al. |
| 5,594,883 A | 1/1997 | Pricer |
| 5,598,370 A | 1/1997 | Niijima et al. |
| 5,638,289 A | 6/1997 | Yamada et al. |
| 5,651,133 A | 7/1997 | Burkes |
| 5,682,497 A | 10/1997 | Robinson |
| 5,682,499 A | 10/1997 | Bakke et al. |
| 5,701,434 A | 12/1997 | Nakagawa |
| 5,742,787 A | 4/1998 | Talreja |
| 5,754,563 A | 5/1998 | White |
| 5,799,140 A | 8/1998 | Niijima et al. |
| 5,799,200 A | 8/1998 | Brant et al. |
| 5,802,602 A | 9/1998 | Rahman et al. |
| 5,805,501 A | 9/1998 | Shiau et al. |
| 5,812,457 A | 9/1998 | Arase |
| 5,845,329 A | 12/1998 | Onishi et al. |
| 5,960,462 A | 9/1999 | Solomon et al. |
| 6,000,019 A | 12/1999 | Dykstal et al. |
| 6,014,724 A | 1/2000 | Jenett |
| 6,125,072 A | 9/2000 | Wu |
| 6,170,039 B1 | 1/2001 | Kishida |
| 6,170,047 B1 | 1/2001 | Dye |
| 6,173,381 B1 | 1/2001 | Dye |
| 6,185,654 B1 | 2/2001 | Van Doren |
| 6,205,521 B1 | 3/2001 | Schumann |
| 6,236,593 B1 | 5/2001 | Hong et al. |
| 6,240,040 B1 | 5/2001 | Akaogi et al. |
| 6,256,642 B1 | 7/2001 | Krueger et al. |
| 6,278,633 B1 | 8/2001 | Wong et al. |
| 6,330,688 B1 | 12/2001 | Brown |
| 6,336,174 B1 | 1/2002 | Li et al. |
| 6,356,986 B1 | 3/2002 | Solomon et al. |
| 6,370,631 B1 | 4/2002 | Dye |
| 6,385,688 B1 | 5/2002 | Mills et al. |
| 6,385,710 B1 | 5/2002 | Goldman et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,470,238 B1 | 10/2002 | Nizar et al. |
| 6,507,911 B1 | 1/2003 | Langford |
| 6,515,909 B1 | 2/2003 | Wooldridge |
| 6,515,928 B2 | 2/2003 | Sato et al. |
| 6,523,102 B1 | 2/2003 | Dye et al. |
| 6,552,955 B1 | 4/2003 | Miki |
| 6,564,285 B1 | 5/2003 | Mills |
| 6,587,915 B1 | 7/2003 | Kim |
| 6,601,211 B1 | 7/2003 | Norman |
| 6,608,793 B2 | 8/2003 | Park et al. |
| 6,625,685 B1 | 9/2003 | Cho et al. |
| 6,629,112 B1 | 9/2003 | Shank |
| 6,633,950 B1 | 10/2003 | Brown et al. |
| 6,633,956 B1 | 10/2003 | Mitani |
| 6,643,181 B2 | 11/2003 | Sofer et al. |
| 6,655,758 B2 | 12/2003 | Pasotti et al. |
| 6,658,438 B2 | 12/2003 | Moore et al. |
| 6,671,757 B1 | 12/2003 | Multer et al. |
| 6,683,810 B2 | 1/2004 | Sakamoto |
| 6,694,453 B1 | 2/2004 | Shukla et al. |
| 6,715,027 B2 | 3/2004 | Kim et al. |
| 6,715,046 B1 | 3/2004 | Shoham et al. |
| 6,735,546 B2 | 5/2004 | Scheuerlein |
| 6,751,155 B2 | 6/2004 | Gorobets |
| 6,754,774 B2 | 6/2004 | Gruner et al. |
| 6,760,806 B2 | 7/2004 | Jeon |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,807,097 B2 | 10/2004 | Takano et al. |
| 6,845,053 B2 | 1/2005 | Chevallier |
| 6,849,480 B1 | 2/2005 | Low et al. |
| 6,865,657 B1 | 3/2005 | Traversat et al. |
| 6,871,257 B2 | 3/2005 | Conley et al. |
| 6,877,076 B1 | 4/2005 | Cho et al. |
| 6,880,049 B2 | 4/2005 | Gruner et al. |
| 6,883,079 B1 | 4/2005 | Priborsky |
| 6,887,058 B2 | 5/2005 | Fujiwara |
| 6,938,133 B2 | 8/2005 | Johnson et al. |
| 6,957,158 B1 | 10/2005 | Hancock et al. |
| 6,959,369 B1 | 10/2005 | Ashton et al. |
| 6,973,551 B1 | 12/2005 | Walton |
| 6,977,847 B2 | 12/2005 | Lasser et al. |
| 6,981,070 B1 | 12/2005 | Luk et al. |
| 6,990,547 B2 | 1/2006 | Ulrich et al. |
| 6,996,676 B2 | 2/2006 | Megiddo et al. |
| 7,010,652 B2 | 3/2006 | Piccirillo et al. |
| 7,042,664 B2 | 5/2006 | Gill et al. |
| 7,043,599 B1 | 5/2006 | Ware et al. |
| 7,050,337 B2 | 5/2006 | Iwase et al. |
| 7,057,936 B2 | 6/2006 | Yaegashi et al. |
| 7,058,769 B1 | 6/2006 | Danilak |
| 7,064,994 B1 | 6/2006 | Wu |
| 7,089,391 B2 | 8/2006 | Geiger et al. |
| 7,096,321 B2 | 8/2006 | Modha |
| 7,107,480 B1 | 9/2006 | Moshayedi et al. |
| 7,167,944 B1 | 1/2007 | Estakhri |
| 7,167,953 B2 | 1/2007 | Megiddo et al. |
| 7,173,852 B2 | 2/2007 | Gorobets et al. |
| 7,177,197 B2 | 2/2007 | Cernea |
| 7,181,572 B2 | 2/2007 | Walmsley |
| 7,194,577 B2 | 3/2007 | Johnson et al. |
| 7,194,740 B1 | 3/2007 | Frank et al. |
| 7,215,580 B2 | 5/2007 | Gorobets |
| 7,219,238 B2 | 5/2007 | Saito et al. |
| 7,227,777 B2 | 6/2007 | Roohparvar |
| 7,243,203 B2 | 7/2007 | Scheuerlein |
| 7,246,179 B2 | 7/2007 | Camara et al. |
| 7,257,129 B2 | 8/2007 | Lee et al. |
| 7,257,690 B1 | 8/2007 | Baird |
| 7,263,591 B2 | 8/2007 | Estakhri et al. |
| 7,275,135 B2 | 9/2007 | Coulson |
| 7,305,520 B2 | 12/2007 | Voigt et al. |
| 7,310,711 B2 | 12/2007 | New et al. |
| 7,328,307 B2 | 2/2008 | Hoogterp |
| 7,340,558 B2 | 3/2008 | Lee et al. |
| 7,340,566 B2 | 3/2008 | Voth et al. |
| 7,340,581 B2 | 3/2008 | Gorobets et al. |
| 7,398,348 B2 | 7/2008 | Moore et al. |
| 7,400,537 B2 | 7/2008 | Hemink et al. |
| 7,403,424 B2 | 7/2008 | Hemink et al. |
| 7,424,593 B2 | 9/2008 | Estakhri et al. |
| 7,441,090 B2 | 10/2008 | Estakhri et al. |
| 7,450,420 B2 | 11/2008 | Sinclair et al. |
| 7,451,344 B1 | 11/2008 | Rothberg |
| 7,457,166 B2 | 11/2008 | Hemink et al. |
| 7,460,432 B2 | 12/2008 | Warner |
| 7,463,521 B2 | 12/2008 | Li |
| 7,463,532 B2 | 12/2008 | Tran et al. |
| 7,464,240 B2 | 12/2008 | Caulkins et al. |
| 7,480,766 B2 | 1/2009 | Gorobets |
| 7,487,320 B2 | 2/2009 | Bansal et al. |
| 7,495,954 B2 | 2/2009 | Ito |
| 7,499,317 B2 | 3/2009 | Ito |
| 7,499,338 B2 | 3/2009 | Ito |
| 7,522,457 B2 | 4/2009 | Hemink et al. |
| 7,529,905 B2 | 5/2009 | Sinclair |
| 7,535,766 B2 | 5/2009 | Ito |
| 7,548,464 B2 | 6/2009 | Kim |
| 7,552,271 B2 | 6/2009 | Sinclair et al. |
| 7,599,967 B2 | 10/2009 | Girkar et al. |
| 7,630,255 B2 | 12/2009 | Yang |
| 7,631,138 B2 | 12/2009 | Gonzalez et al. |
| 7,644,239 B2 | 1/2010 | Ergan et al. |
| 7,652,922 B2 | 1/2010 | Kim |
| 7,725,628 B1 | 5/2010 | Phan et al. |
| 7,743,210 B1 | 6/2010 | Jernigan, IV et al. |
| 7,752,360 B2 | 7/2010 | Galles |
| 7,777,652 B2 | 8/2010 | Lee et al. |
| 7,818,525 B1 | 10/2010 | Frost et al. |
| 7,856,528 B1 | 12/2010 | Frost et al. |
| 7,873,782 B2 | 1/2011 | Terry |
| 7,898,867 B2 | 3/2011 | Hazama et al. |
| 7,903,468 B2 | 3/2011 | Litsyn et al. |
| 7,908,501 B2 | 3/2011 | Kim et al. |
| 7,930,326 B2 | 4/2011 | Doucette et al. |

(56) References Cited

U.S. PATENT DOCUMENTS

| | | |
|---|---|---|
| 7,930,589 B2 | 4/2011 | Lavastre et al. |
| 7,944,762 B2 | 5/2011 | Gorobets |
| 7,970,770 B2 | 6/2011 | Edwards |
| 7,978,541 B2 | 7/2011 | Sutardja |
| 8,001,334 B2 | 8/2011 | Lee |
| 8,010,738 B1 | 8/2011 | Chilton et al. |
| 8,046,551 B1 | 10/2011 | Sahin |
| 8,055,922 B2 | 11/2011 | Brittain et al. |
| 8,130,551 B2 | 3/2012 | Oowada et al. |
| 8,289,801 B2 | 10/2012 | Smith et al. |
| 8,364,888 B2 | 1/2013 | Melik-Martirosian et al. |
| 8,429,436 B2 | 4/2013 | Fillingim et al. |
| 2002/0066047 A1 | 5/2002 | Olarig et al. |
| 2002/0069318 A1 | 6/2002 | Chow et al. |
| 2002/0103819 A1 | 8/2002 | Duvillier |
| 2002/0133743 A1 | 9/2002 | Oldfield |
| 2002/0138686 A1 | 9/2002 | Yang et al. |
| 2002/0181134 A1 | 12/2002 | Bunker et al. |
| 2002/0199056 A1 | 12/2002 | Ayukawa et al. |
| 2003/0028704 A1 | 2/2003 | Mukaida |
| 2003/0028726 A1 | 2/2003 | Gaertner et al. |
| 2003/0061296 A1 | 3/2003 | Craddock et al. |
| 2003/0115405 A1 | 6/2003 | Funyu et al. |
| 2003/0126475 A1 | 7/2003 | Bodas |
| 2003/0145230 A1 | 7/2003 | Chiu et al. |
| 2003/0163630 A1 | 8/2003 | Aasheim et al. |
| 2003/0163663 A1 | 8/2003 | Aasheim et al. |
| 2003/0198084 A1 | 10/2003 | Fujisawa et al. |
| 2003/0210601 A1 | 11/2003 | Lin et al. |
| 2004/0003002 A1 | 1/2004 | Adelmann |
| 2004/0003167 A1 | 1/2004 | Kimura et al. |
| 2004/0064647 A1 | 4/2004 | DeWhitt et al. |
| 2004/0103238 A1 | 5/2004 | Avraham et al. |
| 2004/0114431 A1 | 6/2004 | Shona |
| 2004/0148360 A1 | 7/2004 | Mehra et al. |
| 2004/0177054 A1 | 9/2004 | Stern et al. |
| 2004/0186946 A1 | 9/2004 | Lee |
| 2004/0225719 A1 | 11/2004 | Kisley et al. |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0141313 A1 | 6/2005 | Gorobets et al. |
| 2005/0144361 A1 | 6/2005 | Gonzalez |
| 2005/0193166 A1 | 9/2005 | Johnson et al. |
| 2005/0210323 A1 | 9/2005 | Batchelor et al. |
| 2005/0216653 A1 | 9/2005 | Aasheim et al. |
| 2005/0240713 A1 | 10/2005 | Wu |
| 2005/0246510 A1 | 11/2005 | Retnamma et al. |
| 2005/0246558 A1 | 11/2005 | Ku |
| 2005/0257017 A1 | 11/2005 | Yagi |
| 2005/0262150 A1 | 11/2005 | Krishnaswamy |
| 2005/0267882 A1 | 12/2005 | Aupperlee et al. |
| 2005/0270927 A1 | 12/2005 | Hayashi |
| 2005/0273476 A1 | 12/2005 | Wertheimer et al. |
| 2006/0004955 A1 | 1/2006 | Ware et al. |
| 2006/0020744 A1 | 1/2006 | Sinclair |
| 2006/0053247 A1 | 3/2006 | Cheung et al. |
| 2006/0059326 A1 | 3/2006 | Aasheim et al. |
| 2006/0064556 A1 | 3/2006 | Aasheim et al. |
| 2006/0069870 A1 | 3/2006 | Nicholson et al. |
| 2006/0075057 A1 | 4/2006 | Gildea et al. |
| 2006/0085471 A1 | 4/2006 | Rajan et al. |
| 2006/0095659 A1 | 5/2006 | New et al. |
| 2006/0106990 A1 | 5/2006 | Benhase et al. |
| 2006/0136779 A1 | 6/2006 | Lee et al. |
| 2006/0149893 A1 | 7/2006 | Barfuss et al. |
| 2006/0149916 A1 | 7/2006 | Nase |
| 2006/0179263 A1 | 8/2006 | Song et al. |
| 2006/0184722 A1 | 8/2006 | Sinclair |
| 2006/0184736 A1 | 8/2006 | Benhase et al. |
| 2006/0190552 A1 | 8/2006 | Henze et al. |
| 2006/0230295 A1 | 10/2006 | Schumacher et al. |
| 2006/0248387 A1 | 11/2006 | Nicholson et al. |
| 2006/0265624 A1 | 11/2006 | Moshayedi et al. |
| 2006/0265636 A1 | 11/2006 | Hummler |
| 2006/0294300 A1 | 12/2006 | Lubbers |
| 2007/0016699 A1 | 1/2007 | Minami |
| 2007/0033325 A1 | 2/2007 | Sinclair |
| 2007/0033326 A1 | 2/2007 | Sinclair |
| 2007/0033327 A1 | 2/2007 | Sinclair |
| 2007/0033362 A1 | 2/2007 | Sinclair |
| 2007/0043900 A1 | 2/2007 | Yun |
| 2007/0050571 A1 | 3/2007 | Nakamura |
| 2007/0061508 A1 | 3/2007 | Zweighaft |
| 2007/0083530 A1 | 4/2007 | Lakshminath et al. |
| 2007/0086260 A1 | 4/2007 | Sinclair |
| 2007/0088666 A1 | 4/2007 | Saito |
| 2007/0118713 A1 | 5/2007 | Guterman |
| 2007/0143566 A1 | 6/2007 | Gorobets |
| 2007/0156998 A1 | 7/2007 | Gorobets |
| 2007/0168698 A1 | 7/2007 | Coulson et al. |
| 2007/0198770 A1 | 8/2007 | Horii et al. |
| 2007/0204270 A1* | 8/2007 | Shin ............................ 718/103 |
| 2007/0208790 A1 | 9/2007 | Reuter et al. |
| 2007/0230253 A1 | 10/2007 | Kim |
| 2007/0233937 A1 | 10/2007 | Coulson et al. |
| 2007/0233938 A1 | 10/2007 | Cho et al. |
| 2007/0234021 A1 | 10/2007 | Ruberg et al. |
| 2007/0239926 A1* | 10/2007 | Gyl et al. ..................... 711/103 |
| 2007/0245076 A1 | 10/2007 | Chang et al. |
| 2007/0245094 A1 | 10/2007 | Lee et al. |
| 2007/0260608 A1 | 11/2007 | Hertzberg et al. |
| 2007/0266037 A1 | 11/2007 | Terry et al. |
| 2007/0274150 A1 | 11/2007 | Gorobets |
| 2007/0276994 A1 | 11/2007 | Caulkins et al. |
| 2007/0300008 A1 | 12/2007 | Rogers et al. |
| 2008/0010395 A1 | 1/2008 | Mylly et al. |
| 2008/0052477 A1 | 2/2008 | Lee et al. |
| 2008/0052483 A1 | 2/2008 | Rangarajan et al. |
| 2008/0059820 A1 | 3/2008 | Vaden et al. |
| 2008/0080243 A1 | 4/2008 | Edahiro et al. |
| 2008/0104344 A1 | 5/2008 | Shimozono et al. |
| 2008/0117686 A1 | 5/2008 | Yamada |
| 2008/0126507 A1 | 5/2008 | Wilkinson |
| 2008/0126686 A1 | 5/2008 | Sokolov et al. |
| 2008/0140737 A1 | 6/2008 | Garst et al. |
| 2008/0141043 A1 | 6/2008 | Flynn et al. |
| 2008/0228992 A1 | 9/2008 | Dumitru et al. |
| 2008/0243966 A1 | 10/2008 | Croisettier et al. |
| 2008/0263259 A1 | 10/2008 | Sadovsky et al. |
| 2008/0263305 A1 | 10/2008 | Shu et al. |
| 2008/0263569 A1 | 10/2008 | Shu et al. |
| 2008/0266973 A1 | 10/2008 | Sekar et al. |
| 2008/0282031 A1 | 11/2008 | Tanoue |
| 2008/0301475 A1 | 12/2008 | Felter et al. |
| 2008/0320323 A1 | 12/2008 | Brittain et al. |
| 2009/0031072 A1 | 1/2009 | Sartore |
| 2009/0031098 A1 | 1/2009 | Sartore |
| 2009/0037778 A1 | 2/2009 | Resnick |
| 2009/0091979 A1 | 4/2009 | Shalvi |
| 2009/0091996 A1 | 4/2009 | Chen et al. |
| 2009/0106479 A1 | 4/2009 | Okin et al. |
| 2009/0125700 A1 | 5/2009 | Kisel |
| 2009/0150599 A1 | 6/2009 | Bennett |
| 2009/0150605 A1 | 6/2009 | Flynn et al. |
| 2009/0150621 A1 | 6/2009 | Lee |
| 2009/0157989 A1 | 6/2009 | Karamcheti et al. |
| 2009/0193183 A1 | 7/2009 | Kudo et al. |
| 2009/0239468 A1 | 9/2009 | He et al. |
| 2009/0248763 A1 | 10/2009 | Rajan |
| 2009/0276654 A1 | 11/2009 | Butterworth et al. |
| 2009/0287887 A1 | 11/2009 | Matsuki |
| 2009/0292861 A1 | 11/2009 | Kanevsky et al. |
| 2010/0005228 A1 | 1/2010 | Fukutomi |
| 2010/0023682 A1 | 1/2010 | Lee et al. |
| 2010/0049913 A1 | 2/2010 | Marcu et al. |
| 2010/0082529 A1 | 4/2010 | Mace et al. |
| 2010/0095059 A1 | 4/2010 | Kisley et al. |
| 2010/0102999 A1 | 4/2010 | Lee et al. |
| 2010/0106917 A1 | 4/2010 | Ruberg et al. |
| 2010/0110748 A1 | 5/2010 | Best |
| 2010/0124123 A1 | 5/2010 | Lee |
| 2010/0131826 A1 | 5/2010 | Shalvi et al. |

(56) References Cited

U.S. PATENT DOCUMENTS

| | | | |
|---|---|---|---|
| 2010/0146187 A1 | 6/2010 | Grimsrud et al. | |
| 2010/0153680 A1 | 6/2010 | Baum et al. | |
| 2010/0205335 A1 | 8/2010 | Phan et al. | |
| 2010/0211737 A1 | 8/2010 | Flynn | |
| 2010/0257304 A1 | 10/2010 | Rajan et al. | |
| 2010/0262738 A1 | 10/2010 | Swing et al. | |
| 2010/0262740 A1 | 10/2010 | Borchers et al. | |
| 2010/0262757 A1 | 10/2010 | Sprinkle et al. | |
| 2010/0262758 A1 | 10/2010 | Swing et al. | |
| 2010/0262759 A1 | 10/2010 | Borchers et al. | |
| 2010/0262760 A1 | 10/2010 | Swing et al. | |
| 2010/0262761 A1 | 10/2010 | Borchers et al. | |
| 2010/0262762 A1 | 10/2010 | Borchers et al. | |
| 2010/0262766 A1 | 10/2010 | Sprinkle et al. | |
| 2010/0262767 A1 | 10/2010 | Borchers et al. | |
| 2010/0262773 A1 | 10/2010 | Borchers et al. | |
| 2010/0262894 A1 | 10/2010 | Swing et al. | |
| 2010/0262979 A1 | 10/2010 | Borchers et al. | |
| 2010/0268974 A1 | 10/2010 | Floyd et al. | |
| 2010/0287217 A1 | 11/2010 | Borchers et al. | |
| 2010/0332871 A1 | 12/2010 | Allalouf et al. | |
| 2010/0332897 A1 | 12/2010 | Wilson | |
| 2011/0004722 A1 | 1/2011 | Jeddeloh | |
| 2011/0208911 A1 | 8/2011 | Taguchi et al. | |
| 2011/0225364 A1 | 9/2011 | Edwards | |
| 2012/0030408 A1 | 2/2012 | Flynn et al. | |
| 2012/0239868 A1 | 9/2012 | Ryan et al. | |
| 2012/0254515 A1* | 10/2012 | Melik-Martirosian et al. | 711/103 |
| 2014/0215175 A1* | 7/2014 | Kasorla et al. | 711/167 |
| 2015/0248922 A1 | 9/2015 | Hyun et al. | |

FOREIGN PATENT DOCUMENTS

| | | |
|---|---|---|
| GB | 123416.0 | 9/2001 |
| GB | 0123416.0 | 9/2001 |
| KR | 1020000026300 | 5/2000 |
| KR | 1020010034476 | 4/2001 |
| KR | 1020050024278 | 3/2005 |
| KR | 1020060107728 | 10/2006 |
| TW | 200825696 | 6/2008 |
| WO | 0131512 | 5/2001 |
| WO | 0101365 | 1/2002 |
| WO | 2004099989 | 11/2004 |
| WO | 2005103878 | 11/2005 |
| WO | 2006062511 | 6/2006 |
| WO | 2006065626 | 6/2006 |
| WO | 2008130799 | 3/2008 |
| WO | 2010053756 | 5/2010 |
| WO | 2011106394 | 9/2011 |

OTHER PUBLICATIONS

PCT/US2010/048321, International Search Report, Apr. 28, 2011.
PCT/US2010/048320, International Search Report, Apr. 28, 2011.
Leventhal, Adam, Flash Storage Memory Communications of the ACM, vol. 51, No. 7, Jul. 2008.
Notice of Allowance, U.S. Appl. No. 12/878,981, Jun. 25, 2012.
The International Bureau of WIPO, International Preliminary Report on Patentability for PCT/US2012/024927, dated Aug. 13, 2013.
Advanced Micro Devices, Inc., Am29DL322D/323D/324D Data Sheet, Publication No. 21534, Revision D, Amendment +7, Issue Date Oct. 7, 2004.
Agrawal et al., ECC and Signal Processing Technology for Solid State Drives and Multi-bit per cell NAND Flash Memories, Forward Insights, Report No. Fi-NFL-FSP-0110, (Jan. 2010), 174 pages.
Application No. 201080050702.0, FIO-0102*A-CN, 2380.2.34CN1, Second Office Action, Sep. 19, 2014.
Application No. PCT/US2012/024927, 2380.2.62PCT, FIO-0202*3-WO, IPRP, Aug. 13, 2013.
Am29DL322D/323D/324D Data Sheet, Spansion, Jul. 2003, pp. 57, Publication No. 21534 Revision D, Amendment +7, Issue Date Oct. 7, 2004.

"Intel Turbo Memory with User Pinning", Intel NAND Storage Solutions, 2008, pp. 4.
PCT/US2010/048321 International Search Report, Apr. 28, 2011.
PCT/US2010/048320 International Search Report, Apr. 28, 2011.
Application No. PCT/US2011/064728, International Search Report and Written Opinion, Jul. 31, 2012.
Mellor, Chris, "New RAM Shunts Data Into Flash in Power Cuts", The Channel, Oct. 19, 2011, p. 1, http://www.channelregister.co.uk/2011/10/19/viing_hybrid_dram_nand/.
U.S. Appl. No. 12/878,981, Notice of Allowance, Aug. 28, 2012.
AgigaRAM Company, Technology Review, Feb. 2008, p. 1, reviewed Feb. 17, 2010.
"Agiga Tech Introduction", Agigaram, San Diego, California, US.
"Finding the Perfect Memory", Agiga Tech, White Paper, Sep. 3, 2009, pp. 15, Poway, California, US.
"Bulletproof Memory for RAID Servers, Part 1", Agiga Tech, 2009, pp. 4, http://agigatech.com/blog/bulletproof-memory-for-raid-servers-part-1/.
Ajanovic, Jasmin, "PCI Express* (PCIe*) 3.0 Accelerator Features", Intel Corporation, pp. 10.
Malventano, Allyn, "DDRdrive Hits the Ground Running—PCI-E RAM-based SSD", PC Perspective, May 4, 2009, pp. 2, http://www.pcper.com/article.php?aid=704.
Hutsell, Woody, "An In-depth Look at the RamSan-500 Cached Flash Solid State Disk", Texas Memory Systems, White Paper, Mar. 2008, pp. 16.
Shrout, Ryan, "Gigabyte iRAM Solid State SATA Storage Review", PC Perspective, Apr. 5, 2006, pp. 2, http://www.pcper.com/article.php?aid=224&type=expert.
Wu, Michael, "eNVy: A Non-Volatile, Main Memory Storage System", Association of Computing Machinery, 1994, pp. 12, 0-89791-660-3/94/0010, San Jose, California, US.
Lottiaux, Renaud, "OpenMosix, OpenSSI and Kerrighed: A Comparative Study", INRIA Institut National De Recherche en Informatique et en Automatique, Nov. 2004, pp. 23, No. 5399.
"(Take 2): Transcendent Memory ("tmem") for Linux", LWN Merchandise, 2009, pp. 3, http://lwn.net/Articles/340409/.
Rose, Mike, "FPGA PCIe Bandwidth", University of California San Diego, Jun. 9, 2010, pp. 7, Department of Computer Science and Engineering.
Condit, Jeremy, "Better I/O Through Byte-Addressable, Persistent Memory", Microsoft Research, UCLA, Oct. 11-14, 2009, pp. 14, ACM 978-1-60558-752-3/09/10, Big Sky, Montana, US.
"NAND Flash 101: An Introduction to NAND Flash and How to Design It in to Your Next Product", Micron Technical Note, 2006, pp. 28, TN-29-19: NAND Flash 101 NAND vs. NOR Comparison.
"Pivot3 RAIGE Storage Cluster", Pivot3 White Paper, Jun. 2007, pp. 17, Technology Overview.
Application No. 200780050983.8, Office Action, May 18, 2011.
Application No. 07865334.2, Office Action, Nov. 17, 2010.
"Information Technology—SCSI Object-Based Storage Device Commands (OSD)", Seagate Technology, Jul. 30, 2004, pp. 187, Project T10/1355-D, Revision 10.
Application No. 07865334.2, Office Action, Jan. 30, 2012.
U.S. Appl. No. 11/952,109, Office Action, Mar. 17, 2011.
U.S. Appl. No. 11/952,109, Office Action, Jul. 1, 2011.
Application No. 200780050970.0, Office Action, Oct. 28, 2010.
Application No. 200780050970.0, Office Action, Jun. 29, 2011.
Application No. 200780050970.0, Office Action, Jan. 5, 2012.
U.S. Appl. No. 11/952,113, Office Action, Dec. 15, 2010.
Application No. 200780051020.X, Office Action, Nov. 11, 2010.
Application No. 200780051020.X, Office Action, Jul. 6, 2011.
Application No. 200780051020.X, Nov. 7, 2011.
Application No. 07865345.8, Office Action, Nov. 17, 2010.
Application No. 07865345.8, Office Action, Jan. 30, 2012.
"Actel Fusion FPGAs Supporting Intelligent Peripheral Management Interface (IPMI) Applications", Actel, Oct. 2006, pp. 17, Application Note AC286, Mountain View, California, US.
"Method for Fault Tolerance in Nonvolatile Storage", PriorArtDatabase, Feb. 3, 2005, pp. 6, Technical Disclosure.

(56) References Cited

OTHER PUBLICATIONS

Ismail, Ari, "Performance Boosting and Workload Isolation in Storage Area Networks with SANCache", Hewlett Packard Laboratories, May 2006, pp. 11, Proceedings of the 23rd IEEE/14th NASA Goddard Conference on Mass Storage Systems and Technologies (MSST 2006), College Park, Maryland, US.
"ASPMC-660", ASINE, downloaded Nov. 18, 2009, pp. 3, http://www.asinegropu.com/products/aspmc660.html.
Brandon, Daniel, Jr., "Sparse Matrices in CS Education", 2009, pp. 6, Consortium for Computing Sciences in Colleges.
Coburn, Joel, "NV-Heaps: Making Persistent Objects Fast and Safe with Next-Generation, Non-Volatile Memories", University of California San Diego, 2011, pp. 13, ACM 978-1-4503-0266.1/11/03, Newport Beach, California, US.
"Nand Flash Memories and Programming NAND Flash Memories Using ELNEC Device Programmers", ELNEC, Aug. 2008, pp. 44, Application Note, Version 2.10/08.2008.
Wright, Charles P., "Amino: Extending ACID Semantics to the File System", p. 1.
Gal, Eran, "A Transactional Flash File System for Microcontrollers", USENIX Association, 2005, pp. 16, 2005 USENIX Annual Technical Conference.
Garfinkel, Simson L., "One Big File Is Not Enough" A Critical Evaluation of the Dominant Free-Space Sanitization Technique, Harvard University, Jun. 28, 2006, pp. 31.
Gutmann, Peter, "Secure Deletion of Data from Magnetic and Solid-State Memory", University of Auckland, Jul. 22-25, 1996, pp. 18, Sixth USENIX Security Symposium Proceedings, San Jose, California, US.
Dan Raz, "Implementing MLC NAND Flash for Cost-Effective, High-Capacity Memory", M-Systems, Sep. 2003, pp. 13, 91-SR-014-02-8L, REV 1.1.
"File System Primer", CoolSolutionsWiki, downloaded Oct. 18, 2006, pp. 5, http://wiki.novell.com/index.php/File_System_Primer.
Application No. PCT/US2011/025885, International Preliminary Report on Patentability, Sep. 7, 2012.
Application No. PCT/US2011/025885, International Search Report and Written Opinion, Sep. 28, 2011.
Application No. PCT/US2007/025048, International Search Report and Written Opinion, May 27, 2008.
Application No. PCT/US2007/025048, International Preliminary Report on Patentability, Jun. 18, 2009.
Application No. PCT/US2007/086688, International Search Report and Written Opinion, Apr. 28, 2008.
Application No. PCT/US2007/086688, International Preliminary Report on Patentability, Mar. 16, 2009.
Application No. PCT/US2007/086691, International Search Report and Written Opinion, Aug. 5, 2008.
Application No. PCT/US2007/086691, International Preliminary Report on Patentability, Feb. 16, 2009.
Application No. PCT/US2007/086701, International Search Report and Written Opinion, Jun. 5, 2008.
Application No. PCT/US2007/086701, International Preliminary Report on Patentability, Mar. 16, 2009.
Plank, James S., "A Tutorial on Reed-Solomon Coding for Fault-Tolerance in RAID-like Systems", University of Tennessee, pp. 19, Technical Report CS-96-332, http://www.cs.utk.edu/plank/papers/CS-03-504.html.
Porter, Donald E., "Operating System Transactions", The University of Texas at Austin, Oct. 11-14, 2009, pp. 20.
Rosenblum, Mendel, "The Design and Implementation of a Log-Structured File System", ACM, Feb. 1992, pp. 27, vol. 10, No. 1.
"Introduction to Samsung's Linux Flash File System—RFS", Samsung Electronics, Nov. 2006, pp. 6, Application Note, Version 1.0.
Sears, Russell C., "Stasis: Flexible Transactional Storage", University of California at Berkeley, Jan. 8, 2010, pp. 176, Technical Report No. UCB/EECS-2010-2, http://www.eecs.berkeley.edu/Pubs/TechRpts/2010/EECS-2010-2.html.

Seltzer, Margo Ilene, "File System Performance and Transaction Support", University of California at Berkeley, 1983, pp. 131.
Seltzer, Margo Ilene, "Transaction Support in a Log-Structured File System", Harvard University, pp. 8.
Seltzer, Margo, "Transaction Support in Read Optimized and Write Optimized File Systems", University of California Berkeley, pp. 12.
"Data Management Software (DMS) for AMD Simultaneous Read/Write Flash Memory Devices", Spansion, Jul. 2003, pp. 10, Technology Background, Publication No. 22274, Revision A, Amendment 0.
Spillane, Richard P., "Enabling Transactional File Access via Lightweight Kernel Extensions", Stony Brook University, 2009, pp. 23, Proceedings of the 7th USENIX Conference on File and Storage Technologies.
Tal, Arie, "NAND vs. NOR Flash Technology", M-Systems, Feb. 1, 2002, pp. 3, http://www.electronicproducts.com/Digital_ICs/NAND_vs_NOR_flash_t.
Van Hensbergen, Eric, "Dynamic Policy Disk Caching for Storage Networking", IBM, Nov. 28, 2006, pp. 13, RC24123 (W0611-189).
Volos, Haris, "Mnemosyne: Lightweight Persistent Memory", ACM, 2011, pp. 13, 978-1-4503-0266-1/11,03.
U.S. Appl. No. 11/952,109, Office Action, Nov. 29, 2011.
U.S. Appl. No. 11/952,109, Office Action, May 1, 2012.
U.S. Appl. No. 11/952,113, Office Action, Mar. 6, 2012.
Morgenstern, David, "Is There a Flash Memory Raid in Your Future?", Ziff Davis Enterprise Holdings, Inc., Nov. 8, 2006, pp. 4, http://www.eweek.com.
Application No. PCT/US2007/086687, International Search Report and Written Opinion, May 9, 2008.
Application No. PCT/US2007/086687, International Preliminary Report on Patentability, Mar. 18, 2009.
Application No. PCT/US2011/053795, International Search Report and Written Opinion, May 4, 2012.
Arpaci-Dusseau, Andrea C., "Removing the Costs of Indirection in Flash-based SSDs with Nameless Writes", Microsoft Research, pp. 5.
Leventhal, Adam, "Flash Storage Memory", Communications of the ACM, Jul. 2008, pp. 5, vol. 51, No. 7.
Kawaguchi, Atsuo, "A Flash-Memory Based File System", Hitachi, Ltd., pp. 10.
Mesnier, Mike, "Object-Based Storage", IEEE Communication Magazine, Aug. 2003, pp. 7, Storage Area Networking, 0163-6804/03.
"Am29DL322D/323D/324D", Spansion, Oct. 7, 2004, pp. 57, Publication No. 21534, Revision D, Amendment +7.
"Intel Turbo Memory with User Pinning", Intel, Jan. 2008, pp. 4.
U.S. Appl. No. 12/878,987, Notice of Allowance, Mar. 21, 2013.
U.S. Appl. No. 12/878,987, Office Action, Oct. 18, 2012.
U.S. Appl. No. 60/625,495, Provisional, Nov. 6, 2004.
U.S. Appl. No. 60/718,768, Provisional, Aug. 20, 2005.
U.S. Appl. No. 60/797,127, Provisional, May 3, 2006.
Macko, Peter, "Tracking Back References in Write-Anywhere File System", 8th USENIX Conference on File and Storage Technologies, Feb. 23-26, 2010, pp. 15, San Jose, California, US.
U.S. Appl. No. 13/834,955, Final Office Action, Sep. 8, 2014.
U.S. Appl. No. 13/834,955, Office Action, Apr. 4, 2014.
Application No. 201080050702.0, Office Action, Feb. 20, 2014.
U.S. Appl. No. 10/816,108.4, Search Report, Apr. 2, 2014.
U.S. Appl. No. 11/952,101, Office Action, Jan. 6, 2011.
U.S. Appl. No. 13/015,458, Office Action, Sep. 7, 2012.
Application No. 12176826.1, Search Report, Dec. 10, 2012.
U.S. Appl. No. 13/189,402, Notice of Allowance, Nov. 15, 2012.
U.S. Appl. No. 13/372,430, Office Action, Aug. 6, 2014.
U.S. Appl. No. 13/372,430, Office Action, Nov. 7, 2013.
U.S. Appl. No. 13/372,430, Final Office Action, Apr. 21, 2014.
Application No. PCT/US2007/086702, International Preliminary Report on Patentability, Nov. 19, 2009.
Application No. PCT/US2007/086702, International Search Report and Written Opinion, Nov. 4, 2009.
Hutsell, Woody, "An In-depth Look at the RamSan-500 Cached Flash Solid State Disk", Texas Memory Systems, Mar. 2008, pp. 16.
Suh, Kang-Deog, "A 3.3 V 32 Mb NAND Flash Memory with Incremental Step Pulse Programming Scheme", IEEE Journal of Solid-State Circuits, Nov. 30, 1995, pp. 8, vol. 30, No. 11, New York, US.

(56) References Cited

OTHER PUBLICATIONS

Application No. PCT/US2011/065927, International Search Report, Aug. 28, 2012.
Application No. PCT/US2012/024927, Written Opinion, Oct. 12, 2012.
Application No. PCT/US2012/024927, International Search Report, Oct. 16, 2012.
"File Level Caching", ADABAS Caching Facility, May 11, 2004, pp. 9.
Shrout, Ryan, "Gigabyte iRAM Solid State SATA Storage Review", PC Perspective, Apr. 5, 2006, pp. 6, http://www.pcper.com/article.php?aid+224&type+expert.
Kim, Jin-Ki, "Low Stress Program and Single Wordline Erase Schemes for NAND Flash Memory", MOSAID Technologies Incorporated, 2007, pp. 2, Ottawa, Ontario, Canada.
Application No. PCT/US2011/045801, International Search Report, Apr. 6, 2012.
Application No. PCT/US2011/036539, International Preliminary Report on Patentability, Nov. 13, 2012.
"Introduction to Samsung's Linus Flash File System—RFS", Samsung Electronics Application Noted, Nov. 2006, pp. 6, Version 1.0.
Volos, Haris, "Mnemosyne: Lightweight Persistent Memory", ASPLOS, Mar. 5-11, 2011, pp. 13, Newport Beach, California, US.
Application No. EP11813216, Search Report, Nov. 7, 2013.
U.S. Appl. No. 13/015,458, Notice of Allowance, Sep. 19, 2012.
U.S. Appl. No. 13/748,559, Office Action, Jun. 30, 2014.
Application No. PCT/US2010/029433, International Preliminary Report on Patentability, Jun. 2, 2010.
Application No. PCT/US2011/065927, International Preliminary Report on Patentability, Aug. 28, 2012.
Application No. PCT/US2009/039626, 2380.2.21PCT, International Search Report and Written Opinion, Aug. 27, 2009.
U.S. Appl. No. 13/834,955, Notice of Allowance, Jan. 12, 2015.
U.S. Appl. No. 13/372,430, Notice of Allowance, Nov. 3, 2014.
Application No. PCT/US2015/017804, International Search Report and Written Opinion, May 26, 2015.
Application No. 10816108.4, Office Action, Sep. 30, 2015.

* cited by examiner

ERASE SUSPEND/RESUME FOR MEMORY

BACKGROUND

Flash memory stores data in arrays of memory elements, or cells, formed from floating-gate transistors. NAND flash memory devices return previously stored data by reading a set of bits from individual cells in an array. The time required to erase data from a cell is typically longer than the time required to write data to a cell and typically much longer than the time required to read data from a cell. As sizes for memory elements continue to decrease, erase times and write times continue to increase at a faster rate than read times.

Read operations typically occur at small sets of memory cells, program operations typically occur in the same or larger blocks of multiple memory cells than read operations, and erase operations typically occur at even larger blocks of memory cells. Many flash memory devices are designed to keep read times as low as possible to allow very fast access to the data stored at the memory cells. Write times are typically longer than read times, but shorter than erase times. In various embodiments, a memory device may include one or more chips, and a chip may include one or more memory arrays of memory cells. While an erase operation is being performed for a given cell, other access to the chip on which the cell is located is blocked, including reading data stored at other cells on the same chip or writing data to a block of cells on the same chip. As a result, an application requesting access to a given cell or group of cells for a read operation, a write operation or other operation associated with a memory access request may not be able perform the read/write operation for a significantly long period of time if an erase operation is being performed at the chip on which the given cell is located than if an operation associated with a memory access request is performed automatically upon receipt of the access request.

BRIEF DESCRIPTION OF THE DRAWINGS

Throughout the description, similar reference numbers may be used to identify similar elements.

DETAILED DESCRIPTION

Figure 1:
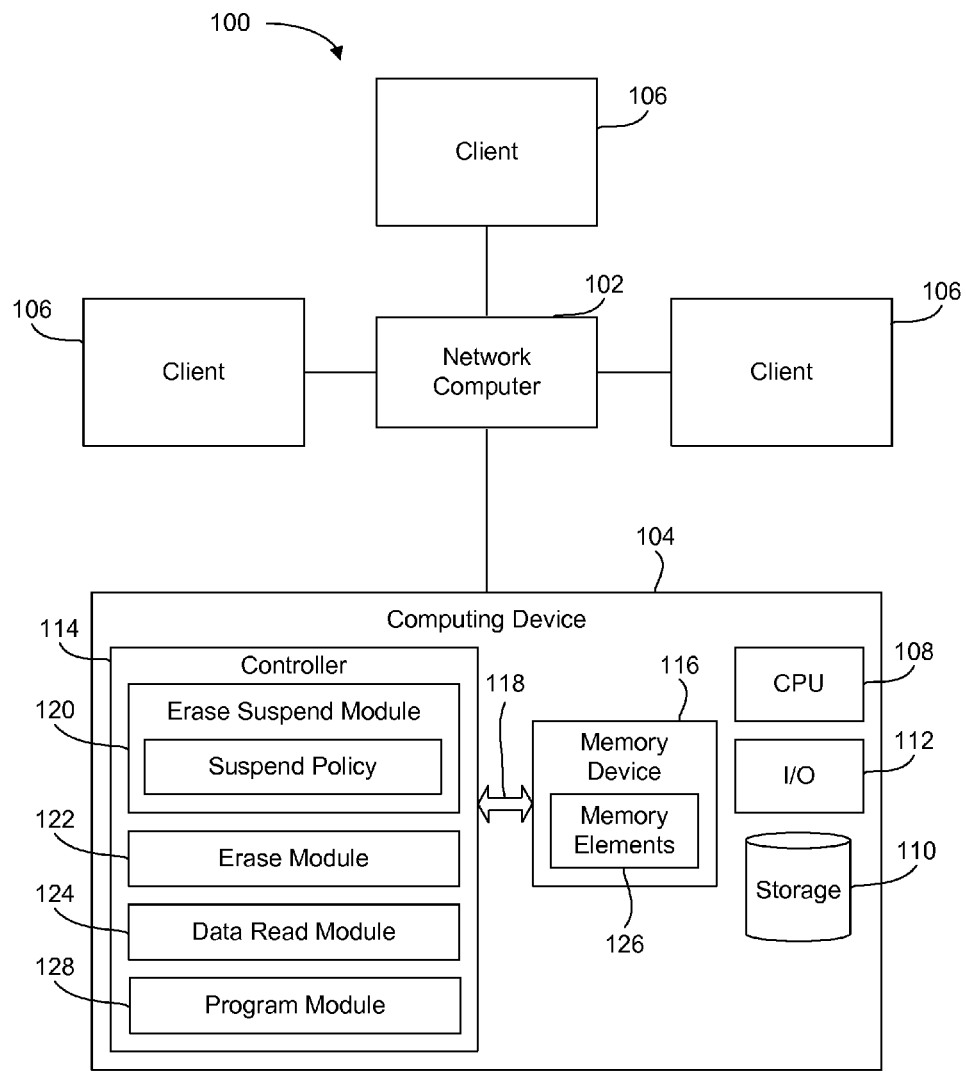
FIG. 1 depicts a schematic diagram of one embodiment of a network system which includes a computing device having a controller for a memory device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Reference to a computer readable medium may take any physical form capable of storing machine-readable instructions, at least for a time in a non-transient state, on a digital processing apparatus. A computer readable medium may be embodied by a compact disk, digital-video disk, a blu-ray disc, a magnetic tape, a Bernoulli drive, a magnetic disk, flash memory, integrated circuits, or other digital processing apparatus memory device.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments facilitate erase suspend/resume operations for an electronic storage device. In other words, an erase operation that is being processed at non-volatile memory (NVM) may be suspended, either temporarily or permanently, in order to allow one or more other memory access operations (e.g., read, write/program, etc.) to be processed at the NVM. As used herein, the term "erase operation" includes any operation to erase a data value represented by a persisted state on the NVM. References herein to an erase operation are inclusive of other equivalent or similar operations.

The electronic storage device may be a NAND flash device that includes a memory array of memory elements. Each memory element is configured to store a charge, voltage, or other electrical parameter to represent the data. In other embodiments, the electronic storage device may include other types of NVM, including other types of flash memory, read-only memory (ROM), magnetic storage devices, optical storage devices, and/or other types of NVM.

The erase suspend operation may be performed to suspend an erase (or equivalent) operation to a given block of memory elements in order to read data from one of the memory elements or to write data to a bock of memory elements on the same chip as the block being erase. In some embodiments, in response to suspending an erase operation, an erase step corresponding to the current erase operation is stored before suspending the erase operation. An operation corresponding to a memory access request, such as a read/write access request, queued behind the erase operation may be performed while the erase operation is suspended, and the erase operation is then resumed at the stored erase step. As described herein, reference to a read/write access request and a read/write operation may be substituted with other memory access requests and operations associated with the other memory access requests, respectively. Additionally, the term "write operation" is broadly interpreted to include programming, setting, burning, or equivalent operation for persisting a state representing a value on NVM.

In some embodiments, the erase operation is suspended only if the erase operation meets a suspend threshold based on a suspend policy. The suspend policy may include any threshold (or condition) that is used to determine whether to suspend an erase operation. In some examples, the suspend policy may determine the suspend threshold based on or including various aspects of the erase operation, the application accessing the memory device, capabilities of the memory device, and/or usage statistics of the memory device. In other examples, the suspend threshold may include other conditions. More specific examples are described in detail below.

As manufacturers create memory elements of smaller sizes for NAND flash devices, the latency, or time delay, associated with read, write, and erase times to memory elements increases. While read times continue to increase, write and erase times are increasing at a faster rate than read times. Additionally, because erase operations are performed on blocks of memory elements larger than program operations, erase times can be significantly longer than write times.

One of the problems caused by this increase in write and erase times using conventional approaches is that program and erase operations may block read operations (or other relatively fast operations) from occurring on the same chip that is currently processing a relatively long program or erase operation. Similarly, erase operations may block program operations from occurring on the same chip that is currently processing the erase operation. Thus, read/write access requests that are submitted to the NAND flash device while an erase operation is being performed may take up to as long as the time needed to perform the full erase operation in addition to the read/write time for the read/write operation associated with the read/write access request.

In order to prevent one or more memory access requests from being stuck behind an erase operation, the erase operation may be suspended or canceled to allow the operation(s) associated with the memory access request to be performed. In some embodiments, the erase operation can then be resumed to finish erasing the data from the selected block of memory elements. Resuming the erase operation may require that the memory device store/preserve data corresponding to the erase operation somewhere on the memory device. Resuming the erase operation at the point where the erase operation was suspended may require that the status, or point where the erase operation is suspended, also be stored. The current erase step may be stored at a buffer, register or at some other location on the NAND flash device or at the controller. Information related to the erase operation may include how much of the erase operation has been performed and which erase blocks on the chip were being erased. In one example, the information may be used to resume the operation at the stored erase step. In another example, the information may be used to resume the operation from the beginning of the erase operation. In another example, the erase operation may be resumed at a point between the beginning of the erase operation and the stored erase step, such that part, but not all, of the erase operation is repeated. Some embodiments also allow for additional criteria to be used in determining whether an erase operation should be suspended or canceled to optimize read/write/erase times and to maximize the life of the device.

FIG. 1 depicts a schematic diagram of one embodiment of a network system 100 that includes a computing device having a controller for a memory device. The depicted network system 100 includes various components, described in more detail below, that are capable of performing the functions and operations described herein. In one embodiment, at least some of the components of the network system 100 are implemented in a computer system. For example, the functionality of one or more components of the network system 100 may be implemented by computer program instructions stored and executed on another computing device 102. The network system 100 may include other components, such as a computing device 104 and one or more remote computing devices 106. The computing device 104 may include various components, including a processor 108 (such as a CPU), a storage device 110, input/output devices 112, a controller 114, and a memory device 116. The memory device 116 may include non-volatile memory and/or volatile memory. Some or all of the components of the network system 100 may be stored on a single computing device or on a network of computing devices, including a wireless communication network. The network system 100 may include more or fewer components or subsystems than those depicted herein. In some embodiments, the network system 100 may be used to implement the methods described herein.

In one embodiment, the controller 114 includes a physical input/output (I/O) interface 118 configured to couple the controller 114 to the memory device 116. In various embodiments, the controller 114 may be implemented by hardware, firmware, a driver, or other implementations capable of controlling operations in a memory device 116.

The memory device 116 includes one or more memory elements 126. In one embodiment, the memory device 116 is a NAND flash memory device. Other embodiments may incorporate other types of electronically erasable programmable memory devices. In some embodiments, the memory device 116 includes a single die with an array of memory elements 126, which is referred to herein as a memory array. In other embodiments, the memory device 116 corresponds to an integrated circuit (IC) package, or chip. Each chip may include one or more die, and each die includes an array of memory elements 126. In some embodiments, the memory device 116 includes a common circuit board used to mount a plurality of IC packages or chips, which arrangement is referred to herein as a chip array or a NAND array. For example, a chip array of 8, 16, 32, etc. chips may be mounted to a peripheral memory card that can be connected to a peripheral slot of a computing device. In some embodiments, the controller 114 is also mounted to the same circuit board as the chip array. Alternatively, the controller 114 may be located remotely (i.e., on a different circuit board) from one or more circuit boards with a chip array with which the controller 114 communicates.

The memory device 116 may be used for storing data associated with the computing device 104 and/or the network system 100. Although the computing device 104 is shown with a single memory device 116, other embodiments of the computing device 104 may include more than one memory device 116. Similarly, multiple memory devices 116 may be implemented at various locations within the network system 100. Embodiments of the network system 100 may provide dedicated or shared memory resources for one or more of the remote computing devices 106 and computing device 104, though other implementations of storage/memory resources or capacity may be used in conjunction with the network system 100.

The memory elements 126 may be single level cell (SLC) flash elements, multi-level cell (MLC) flash elements or tri level cell (TLC) flash elements. In general, solid-state memory elements 126 can be set to different programmable states that correspond to different bits or bit combinations. The memory elements 126 may be operated in a variety of modes in different embodiments. In a specific example, MLC flash elements may be operated in an SLC mode to store a single bit of data. In another example, the MLC flash elements may be operated in an MLC mode to store two or more bits of data per state. In other embodiments, the memory device 116 includes other types of memory elements 126 configured to operate in the modes described herein or in other modes.

In various embodiments, the memory device 116 may be a non-volatile memory device 116 in the form of a dual-inline memory module ("DIMM"), a daughter card, or a micro-module. In another embodiment, the memory device 116 is an element within a rack-mounted blade. In another embodiment, the memory device 116 is contained within a package that is integrated directly onto a higher level assembly (e.g., mother board, laptop, graphics processor, etc.). In another embodiment, individual components including the memory device 116 are integrated directly onto a higher level assembly without intermediate packaging.

The illustrated controller 114 includes an erase suspend module 120, an erase module 122, a data read module 124, and a program module 128. Other embodiments of the controller 114 may include fewer or more modular components. Additionally, the components described herein may perform the operations described herein in any manner, either separately or in conjunction with other components of the controller 114, memory device 116, and/or computing device 104.

In one embodiment, the program module 128 programs one or more bits of a memory element 126 of the memory device 116. In one embodiment, the program module 128 programs memory elements 126 by issuing an instruction to the memory device 116 to begin a program operation. The memory device 116 may then program the memory elements 126 by setting the memory elements 126 to a voltage level or state that represents one or more bits. The memory elements 126 may be programmed to different states depending on the desired bit configuration for each memory element 126. The data read module 124 reads at least one data bit from the memory element 126. In one embodiment, the data read module 124 reads the bit from the memory element 126 by detecting the current state for the memory element 126 and determining the bit(s) represented by the state. The erase module 122 erases data stored at a memory element 126 of the memory device 116 in an erase operation. The erase module 122 may perform erase operations on a block of memory elements 126. In one embodiment, the erase module 122 erases data by issuing an instruction to the memory device 116 to erase the data at a block of memory elements 126 specified in an erase access request. The erase suspend module 122 suspends an erase operation at a memory element 126 or group of memory elements 126. In one embodiment, the erase suspend module 122 suspends an erase operation by issuing an instruction to the memory device 116 to suspend the erase operation. The memory device 116 may then suspend the erase operation. The manner in which the erase suspend process is implemented herein may affect some aspects of the erase process implemented by the erase module 122, the program process implemented by the program module 128, and the read process implemented by the data read module 124. While the modules are described herein as being a part of the controller 114, the modules may be at the memory device 116 or at another location in the system 100.

The data read module 124 may determine or monitor a read time of the memory device 116. The read time refers to the time it takes for the memory device 116 to read the settings, or charge values, of the memory elements 126 in a word line and make corresponding digital signals available to the controller 114. In some embodiments, the overall read process includes the time it takes for the memory device 116 to perform various processing and development stages, including the time required to build up charge on the memory elements 126 to be read, develop charge at the sense amplifiers 146, and dissipate remaining charges within the memory array. In various embodiments, the read time for a read operation may be approximately 30-40 microseconds for lower page data and approximately 50-60 microseconds for upper page data.

In one embodiment, the program module 128 determines, monitors, and/or sets a write time of the memory device 116. The write time refers to the time it takes to write data to the memory elements 126 by setting charge values for the memory elements 126 to specific levels. Program operations may be done for a block of memory elements 126 determined by the program module 128. The program module 128 may write data to a memory element 126 using an upper page write and a lower page write. In one example, an upper page write may take approximately 2 milliseconds. In another example, an upper page write may take approximately 2.3 milliseconds or longer. As the physical size of memory elements 126 continues to decrease, the upper page write may take even longer. Smaller memory elements 126 store fewer electrons. In order not to over-program the memory elements 126, smaller pulses are used. Because smaller pulses are used, more pulses may be required, which takes more time. Using different step sizes and starting voltages for programming the upper page write may also affect the write time.

In one embodiment, the erase module 122 determines or monitors an erase time of the memory device 116. The erase time refers to the time it takes to erase data from memory elements 126 by setting charge values for the memory elements 126 to a specific level designated as an erase state. In one example, the erase time may take from approximately 2 milliseconds to 20 milliseconds. In one example, the erase state is associated with a negative charge value, though the erase state may be associated with any charge value according to the specific programming scheme for the memory elements 126.

The erase suspend module 120 may implement a mechanism to allow flexibility in tuning and improving read, write, and erase performance. In some embodiments, the mechanism includes a suspend policy, which may include any threshold or condition that determines when an erase operation should be suspended in order to perform one or more other operations on the same chip and when an erase operation should be completed before performing other operations. The suspend policy may include various criteria, including, but not limited to, the completion percentage of the erase operation, the number of read/write operations behind the erase operation, the priority of the read/write operations behind the erase operation, the number of times that the erase operation has been previously suspended, and a comparison of the cost/benefit of suspending the erase operation. In some embodiments, the suspend policy may determine whether to resume the erase operation from the step at which the erase operation is suspended or to start the erase operation over. In another embodiment, the erase operation may be resumed at a point between the beginning of the erase operation and the stored erase step, such that part, but not all, of the erase operation is repeated. In some embodiments, application usage of the memory device 116 influences how and/or when the erase suspend module 120 suspends erase operations to the memory device 116. For example, write sensitive applications that submit a high number of write access requests to the memory device 116 may require that the memory device 116 perform erase operations more frequently than applications that have a low number of write access requests to the memory device 116. If an application is write sensitive, the erase suspend module 120 may be less likely to suspend an erase operation when receiving a memory access request than for applications that are not write sensitive.

In some embodiments, the performance parameters or device characteristics of the memory device 116 influence how and/or when the erase suspend module 120 suspends erase operations to the memory device 116. In one embodiment, the device characteristics include usage statistics of the memory elements 126. In various embodiments, the usage statistics may include program/erase (P/E) cycle counts per erase block (EB), bit error rate (BER, as well as the RBER and/or UBER), typical device temperature, and/or other usage statistics. For example, as the P/E cycle counts for the EBs increase, erase operations at the memory device 116 may take longer. In one embodiment, the probability that erase operations are suspended increases as the P/E cycle counts increase because memory access requests queued behind erase operations may have longer wait times if the erase operations are allowed to complete before performing the operations associated with memory access requests. In another embodiment, the device characteristics include the geometric size of the memory element 126 (e.g. 24 nanometers (nm), 21 nm, 32 nm, etc.), the manufacturer, the number of failed cells or other physical or inherent characteristics of the memory element 126.

In some embodiments, the erase suspend module 120 is configured to store information that defines the erase operation, including an erase step at which the current erase operation is suspended. In one embodiment, the erase step includes information describing the electrical pulses used to set the state of the memory elements 126 to the erase state and the current voltage values stored at the memory elements 126. Such information may include, but is not limited to, step count, pulse duration, pulse magnitude, and step magnitude. Additional information, such as the addresses corresponding to the memory elements 126 being erased, may also be stored. The information defining the erase operation may be tracked while the erase operation is running, for example at the controller 114 or at a component on the memory device 116, so that when the erase operation is suspended, the information may be retained for resuming the erase operation. The information may be stored in a non-volatile storage so that the information is retained in the event of a power loss.

In one embodiment, as described in more detail below with reference to FIGS. 3A-3B, the erase operations are performed using incremental step pulse erase (ISPE), in which a memory element 126 is programmed to a specific state (bit combination) or set to an erase state using small, incremental voltage steps or pulses. Suspending the erase operation may include suspending the erase operation at a specific incremental voltage step. The current voltage level and/or number of voltage steps that have been applied to the memory element 126 may be stored. When the erase operation is resumed, the memory device 116 may use the stored voltage level and/or number of voltage steps to determine where to resume the erase operation to the memory element 126. The erase operation may be resumed at the stored voltage step, at a step lower or near the stored voltage step, at the beginning of the erase operation, or at any voltage step as determined by the erase suspend module 120. In another embodiment, another module or component may determine when and where to resume the erase operation. Although the erase operation is described above using ISPE, the erase operation may be performed using any programming/erasing method to a memory element 126 and the erase operation may be resumed in accordance with the programming/erasing method.

In other embodiments, another component of the controller 114, computing device 104, or memory device 116 may store such information—for example, a buffer or register at the memory device 116. When an erase operation is suspended, application access to the block being programmed may be blocked until after the erase operation is resumed and completed.

The erase suspend module 120 suspends an erase operation at a specified block of the memory device 116 in response to receiving a read/write access request or other memory access request. Alternatively, another module or component in communication with the program suspend module 120 in the controller 114 may receive the memory access request and indicate to the erase suspend module 120 that an access request has been received and that the erase operation should be suspended. To suspend the erase operation, the erase suspend module 120 may issue a suspend command to the memory device 116, which then suspends the erase operation. The request may come from an application on the computing device 104 or on a network computer 102. In one embodiment, the controller 114 receives an access request from an application to read data from the memory device 116 or to write data to the memory device 116. The access request may include a read/write signal that includes information about the data to be read from or written to the memory device 116. In some embodiments, the controller 114 generates additional information for a read/write signal to be sent to the memory device 116. The read/write signal may then be sent to the memory device 116 to perform the read/write operation after the erase suspend module 120 has suspended the erase operation or after the erase operation is completed. In another embodiment, the controller 114 receives an erase access request with a higher processing priority than a current erase operation occurring at the memory device 116. The priority of the erase access request may be determined at an operating system level, at the controller 114 or at the memory device 116. Priority may be established at the controller 114 or memory device 116 according to a user-specified priority list, application read/write sensitivity, storage capabilities of the memory device 116, and/or other criteria. The current erase operation may be suspended to allow the memory device 116 to perform the erase operation associated with the higher priority erase access request. In other embodiments, the controller 114 receives other types of access requests that have a higher priority than the current erase operation.

In some embodiments, the erase suspend module 120 sends a suspend command to the memory device 116 automatically upon receiving the access request for the read/write operation. In some embodiments, the erase suspend module 120 sends a suspend command to the memory device 116 at some period of time after receiving the access request. For example, the erase suspend module 120 may first make a determination that the erase operation should be suspended before sending the suspend command. The erase suspend module 120 may determine that the erase operation should not be suspended, and the read/write operation corresponding to the access request is not completed until after the erase operation is completed. For example, the erase suspend module 120 may determine that the erase operation should not be suspended if a certain percentage (or number of voltage steps) of the erase operation has been reached. The percentage or number of voltage steps at which the erase operation is suspended may be determined based on age of the device, the number of access requests behind the erase operation, the priority of the access requests, and/or other factors related to the memory device 116, controller 114 or application 128. In some embodiments, some of the operations for determining whether the erase operation should be suspended are done at the memory device 116.

Figure 2:
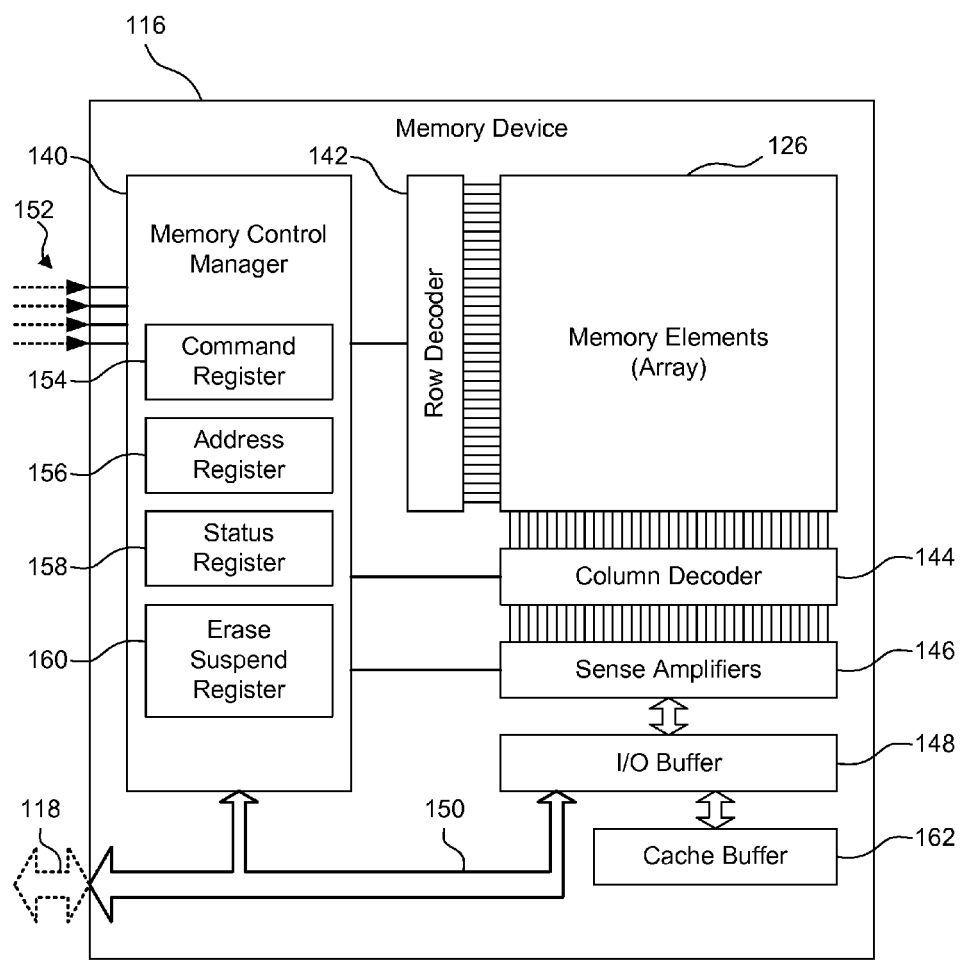
FIG. 2 depicts a schematic diagram of one embodiment of the memory device of FIG. 1.

FIG. 2 depicts a schematic diagram of one embodiment of the memory device 116 of FIG. 1. The illustrated memory device 116 includes the memory elements 126, a memory control manager 140, a row decoder 142, a column decoder 144, a plurality of sense amplifiers 146, an input/output (I/O) buffer 148, and an I/O bus 150. Although the memory device 116 is shown in FIG. 2 with certain components and described herein with certain functionality, other embodiments of the memory device 116 may include fewer or more components to implement similar or different functionality.

In general, the memory control manager 140 controls read, write and erase operations at the memory elements 126. The read, write, and erase operations are collectively referred to as memory access operations. The memory control manager 140 controls the application of different voltage levels at the row decoder 142 and/or the column decoder 144 to perform the memory access operations at some or all of the memory elements 126. Although the memory device 116 is shown with only a single array of memory elements 126, other embodiments may include multiple arrays of memory elements 126, in which case each array may have its own row decoder 142 and column decoder 144, but may share the same memory control manager 140.

In one embodiment, control signals from the controller 114 are transmitted to the memory device 116 via one or more control signal lines 152. Some examples of possible control signals include, but are not limited to chip select, read, write, erase, address, suspend and resume signals. Similarly, data is transferred between the controller 114 and the memory device 116 via a data bus 150 (e.g., 8-bit). Within the memory device 116, the data bus 150 may be coupled to the memory control manager 140 and the I/O buffer 148. Other embodiments may use a different number or configuration of communication channels for control, address, and data signals between the controller 114 and the memory device 116.

In order to perform a read/write/erase operation, the controller 114 may send a read/write/erase signal to the memory control manager 140. The write signal may include a write command and a range of addresses for a block of memory elements 126 to be programmed, and the read signal may include a read command and an address (or range of addresses) to be read. The erase signal may include an erase command and a range of addresses for a block of memory elements 126 to be erased. In one embodiment, the memory control manager 140 stores the read/write/erase command in a command register 154. Similarly, the memory control manager 140 stores the address(es) in an address register 156. Upon initiating the corresponding operation, the memory control manager 140 may store a status bit value in a status register 158 to indicate that the memory control manager 140 is busy processing the read/write/erase command. As an example, the memory control manager 140 may store a bit value of zero (0) in the status register 158 to indicate that the memory control manager 140 is busy processing the read/write/erase command, although other embodiments may use other bit quantity/value conventions. Storing a bit value in the status register 158 may allow the controller 114 to check the status bit in order to determine if the memory device 116 is busy processing a read/write/erase command.

In one embodiment, when writing data to the memory elements 126, digital signals are transferred via an I/O bus 150 to a main I/O buffer 148 and then to the sense amplifiers 146. The sense amplifiers 146 convert the digital values to corresponding analog signals and modify the signals as needed. The memory control manager 140 uses the addresses provided in the write command to write to column values for a given row (or rows) within the array. In particular, the memory control manager 140 controls the row decoder 142 to activate a particular row and, simultaneously, controls the column decoder 144 to transfer values from the sense amplifiers 146 to the selected row(s) and column(s).

In order to retrieve the stored data from the memory elements 126, the memory control manager 140 uses the address(es) to read out column values for a given row (or rows) within the array. In particular, the memory control manager 140 controls the row decoder 142 to activate a particular row and, simultaneously, controls the column decoder 144 to transfer column values from the selected row of memory elements 126 to corresponding sense amplifiers 146. In the present embodiment, the sense amplifiers 146 convert the stored analog signals to corresponding digital values, amplify the signals as needed, and transfer the digital signals to the I/O buffer 148.

When data is available at the I/O buffer 148 either for writing to the memory elements 126 or due to reading from the memory elements 126, the memory control manager 140 may set a status bit within the status register 158 to indicate that data is ready to be written or read. The memory control manager 140 may control the operations of the decoders and sense amplifiers 146 for writing data to the memory elements 126 or reading data from the memory elements 126. The memory control manager 140 may also indicate to the controller 114 that data is at the I/O buffer 148 to be read. For example, the memory control manager 140 may store a bit value of one (1) in the status register 158 to indicate that the data is ready to be read.

In order to erase data stored at the memory elements 126, the memory control manager 140 uses the addresses corresponding to the erase signal to access column values for a given row (or rows) within the array. In particular, the memory control manager 140 controls the row decoder 142 and column decoder 144 to access the memory elements at the addresses specified by the erase operation. In one embodiment, when the corresponding rows/columns are accessed, the memory control manager 140 applies a voltage value to the memory elements 126 to place the memory elements 126 in an erase state, which erases the stored values.

When the memory device 116 is performing an erase command at a given range of addresses for a block of memory elements 126, the memory device 116 is not able to perform other command at any of the memory elements 126 on the same chip or chips as the given range of addresses. Thus, any read/write operations to be performed on the chip where an erase operation is occurring are blocked from being performed as long as the erase operation is occurring.

In some embodiments, the memory control manager 140 includes an erase suspend register 160 to indicate whether an erase operation is to be suspended or is currently suspended. If the memory control manager 140 receives a read/write signal from the controller 114 to read data from or write data to a chip while an erase operation is being performed on the chip, the memory control manager 140 may determine to suspend the erase operation in order to perform the read/write operation. The memory control manager 140 may then set a bit of the erase suspend register 160 to indicate that the memory control manager 140 is suspending the current erase operation. As an example, the memory control manager 140 may store a bit value of one (1) in the erase suspend register 160 to indicate that the current erase operation is suspended.

In one embodiment, the memory control manager 140 suspends the erase operation in response to receiving a suspend command from the controller 114 after the controller 114 makes a determination to suspend the erase operation. Other embodiments may include other conventions of suspending the erase operation and indicating to the controller 114 that the erase operation is suspended while a read/write operation is performed.

In the embodiment of FIG. 2, the I/O buffer 148 is used for performing program operations and read operations for the memory elements 126. In one embodiment, a cache buffer 162 is used to store data corresponding to erase operations. In other embodiments, the data corresponding to the erase operation may be stored elsewhere on the memory device 116 or at the controller 114. In one embodiment, when the memory control manager 140 suspends the erase operation, the data corresponding to the erase operation is stored in the cache buffer 162 for temporary storage while the erase operation is suspended. The memory control manager 140 may then perform the read/write operation at the memory elements 126 and retrieve the data stored at the specified address(es) or write the data to the specified address(es).

For a read operation, once initial data from the memory elements 126 is available at the I/O buffer 148, the memory control manager 140 may set the status bit within the status register 158 to indicate that the controller 114 can request the data retrieved from the memory elements 126. For example, the memory control manager 140 may store a bit value of one (1) in the status register 158 to indicate that the memory control manager 140 is done processing the initial data of the read command. The data values from the I/O buffer 148 then may be transferred to the controller 114 via the data bus 150 and the physical I/O interface 118.

For a write operation, once the data to be stored at the memory elements 126 is available at the I/O buffer 148, the memory control manager 140 may set the status bit within the status register 158 to indicate that the data is available for the sense amplifiers 146. The data values from the I/O buffer 148 may then be written to the memory elements 126 via the sense amplifiers 146.

After the read/write operation is completed and the data stored at the I/O buffer is transferred to the controller 114 or written to the memory elements 126 according to the corresponding read/write signal, the erase operation may be resumed. In one embodiment, after the controller 114 receives the data for the read operation, the controller 114 sends a resume command to the memory control manager 140 to resume the erase operation. In another embodiment, after the data in the I/O buffer has been written to the memory elements 126, the memory control manager 140 resumes the erase operation. When the erase operation is resumed, the data stored in the cache buffer 162 may then be used by the memory control manager 140 to resume the erase operation from the stored erase step.

Figure 3A:
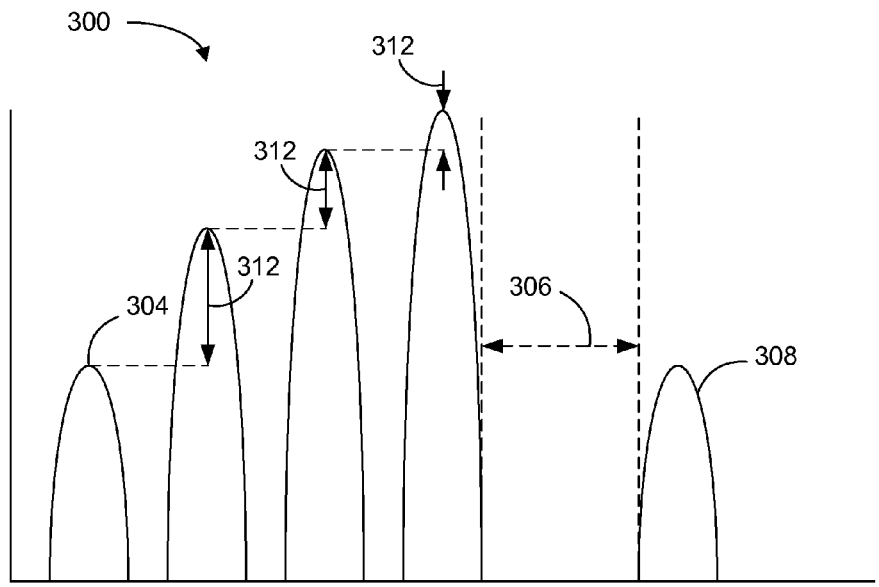
FIGS. 3A-3B depict graph diagrams of embodiments of voltage pulses in an erase operation.
Figure 3B:
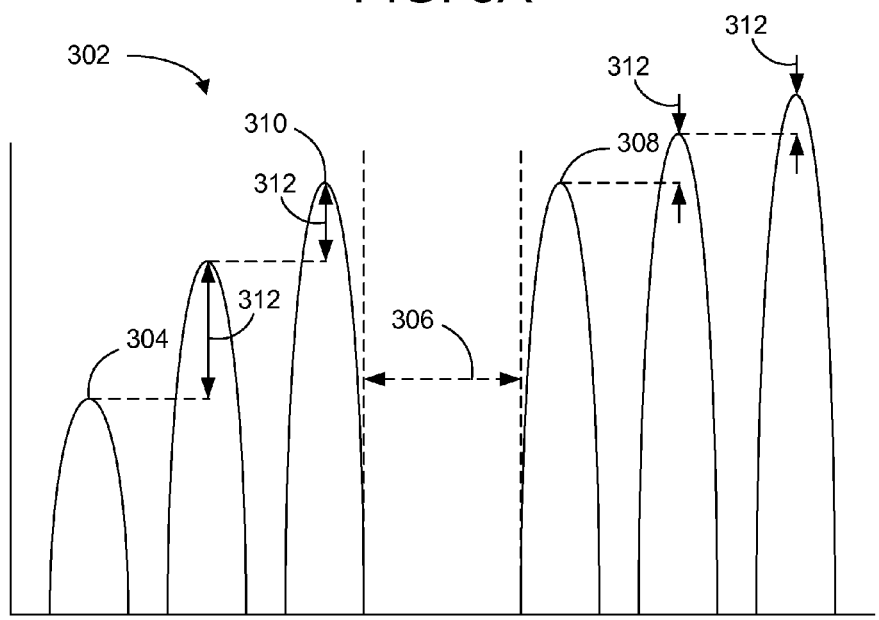

FIGS. 3A-3B depict graph diagrams 300, 302 of embodiments of voltage pulses in an erase operation. As described herein, the voltage pulses for an erase operation may be performed using an ISPE approach. While the erase operation is described herein in conjunction with the ISPE approach shown in FIGS. 3A-3B, the erase operation may be implemented using any erasing approach. In the embodiments of FIGS. 3A and 3B, the x-axes represent time and the y-axes represent the voltage amplitude/magnitude of pulses applied to the memory element 126.

FIG. 3A depicts a graph diagram 300 of an embodiment of voltage pulses for a erase operation at a memory element 126 that is suspended to perform an operation corresponding to a memory access request queued behind the erase operation. The erase operation may be performed using incremental pulses which incrementally increase or change the voltage level of each pulse, which in turn increases or changes the voltage level stored at the memory element 126. In one embodiment, the first pulse 304 applied to the memory element 126 has the lowest pulse amplitude of the pulses, and the amplitude for each subsequent pulse in the erase operation increases as the voltage level stored in the memory element 126 gets closer to the voltage level for the desired state. The pulse delta 312 (or change in voltage level for each pulse) from one pulse to the next decreases as the voltage level stored at the memory element 126 gets closer to the voltage level for the desired state. In one embodiment, the first voltage pulse 304 has the highest delta 312 as compared to the pulse deltas 312 for each subsequent pulse, such that the change in voltage for the first pulse 304 (from zero voltage or other base voltage) is the greatest single change in voltage than for any of the subsequent pulses of the erase operation. When the memory access request is received by the memory device 116, the erase operation may be suspended and the operation 306 corresponding to the memory access request is performed.

In one embodiment, as shown in FIG. 3A, the erase operation is resumed from the beginning of the erase operation, such that the first pulse 308 applied to the memory element 126 after resuming the erase operation has the same or approximately the same amplitude as the initial pulse 304. In various examples, the erase operation may be resumed from the beginning of the erase operation if the erase operation had been suspended for a certain amount of time or if the erase operation had progressed to a certain percentage of completion or to a certain voltage level. For erase operations that are resumed from the beginning of the erase operation, information that describes a progress of the erase operation may not need to be stored, or if it has been stored, it may be discarded.

In another embodiment, as shown in the graph diagram 302 of FIG. 3B, the erase operation is resumed where the erase operation was suspended to perform the operation 306 corresponding to the memory access request queued behind the erase operation. In such an embodiment, the information that describes the progress of the erase operation may be stored. The information may be stored at the memory device 116, at the controller 114, or at any location accessible to the memory device 116. The information may include a pulse (or step) count, a pulse amplitude, a pulse width or duration, and other information that describes the pulse(s) and progress of the erase operation. The information may also include information about the current voltage step stored at the memory element 126.

When the erase operation is resumed, the information may be retrieved and the erase operation may be resumed using the stored information. In one example, the erase operation is resumed by continuing the ISPE process from the last stored pulse 310 and applying subsequent pulses to the memory element 126, such that the first pulse 308 after resuming the erases operation has a greater amplitude than the last stored pulse 310. If the erase operation has been suspended for a certain amount of time, the erase operation may be resumed at a point in the ISPE process sometime before the point at which the erase operation was suspended. For example, the erase operation may be resumed by applying a pulse equal to the last stored pulse or a pulse of smaller magnitude than the last stored pulse 310. In other examples, the erase operation may be resumed by resuming the ISPE process at any point in the erase operation using the stored information.

Figure 4:
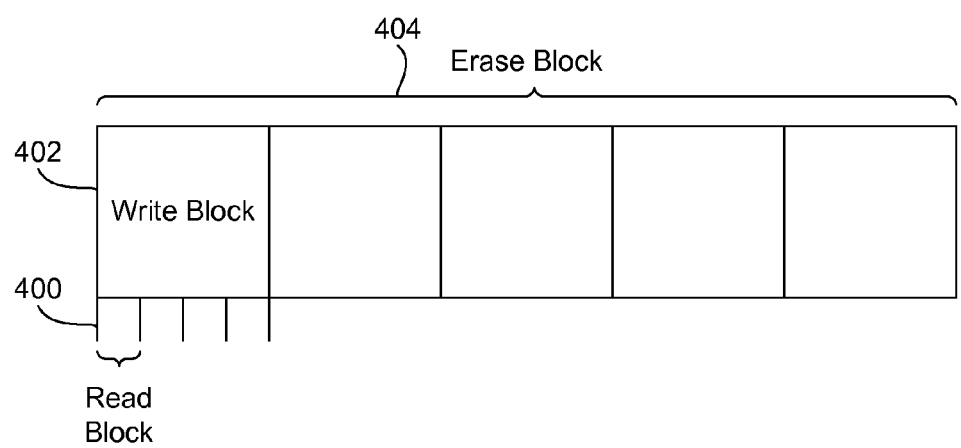
FIG. 4 depicts a block diagram of an embodiment of blocks in the memory device of FIG. 2.

FIG. 4 depicts a block diagram of an embodiment of blocks in the memory device 116 of FIG. 2. While the blocks of FIG. 3 are described herein in conjunction with the memory device 116 of FIG. 2, the block may be used in conjunction with any type of memory device 116. Alternatively, the memory device 116 of FIG. 2 may use any arrangement or size of blocks of memory elements 126.

As used herein, the term "block" is broadly interpreted to include one or more memory elements 126 in the memory device 116. Blocks of memory elements 126 may be different sizes for each operation performed at the memory elements 126. For example, read operations may be performed for read blocks 400 of individual memory elements 126 or other small group of memory elements 126. Write operations may be performed on a write block 402, which may include a plurality of memory elements 126, such that data is written to each of the memory elements 126 in the write block 402 in a single operation. Thus, a write operation is performed on a larger block of memory elements 126 than a read operation. Erase operations may be performed on an erase block 404, such that data stored at the memory elements 126 in the erase block 404 is erase in a single erase operation. In the embodiment of FIG. 3, the erase block is larger than the write block 402, such that the erase block 404 contains several write blocks 402.

Because of the different sizes of blocks for read/write/erase operations, write operations typically take much longer than read operations, and erase operations typically take much longer than both read operations and write operations. Additionally, erase operations performed on a given chip prevent read/write operations from being performed to the memory elements 126 within the erase block 404, as well as to any memory elements 126 on the same chip as the erase block 404.

Figure 5:
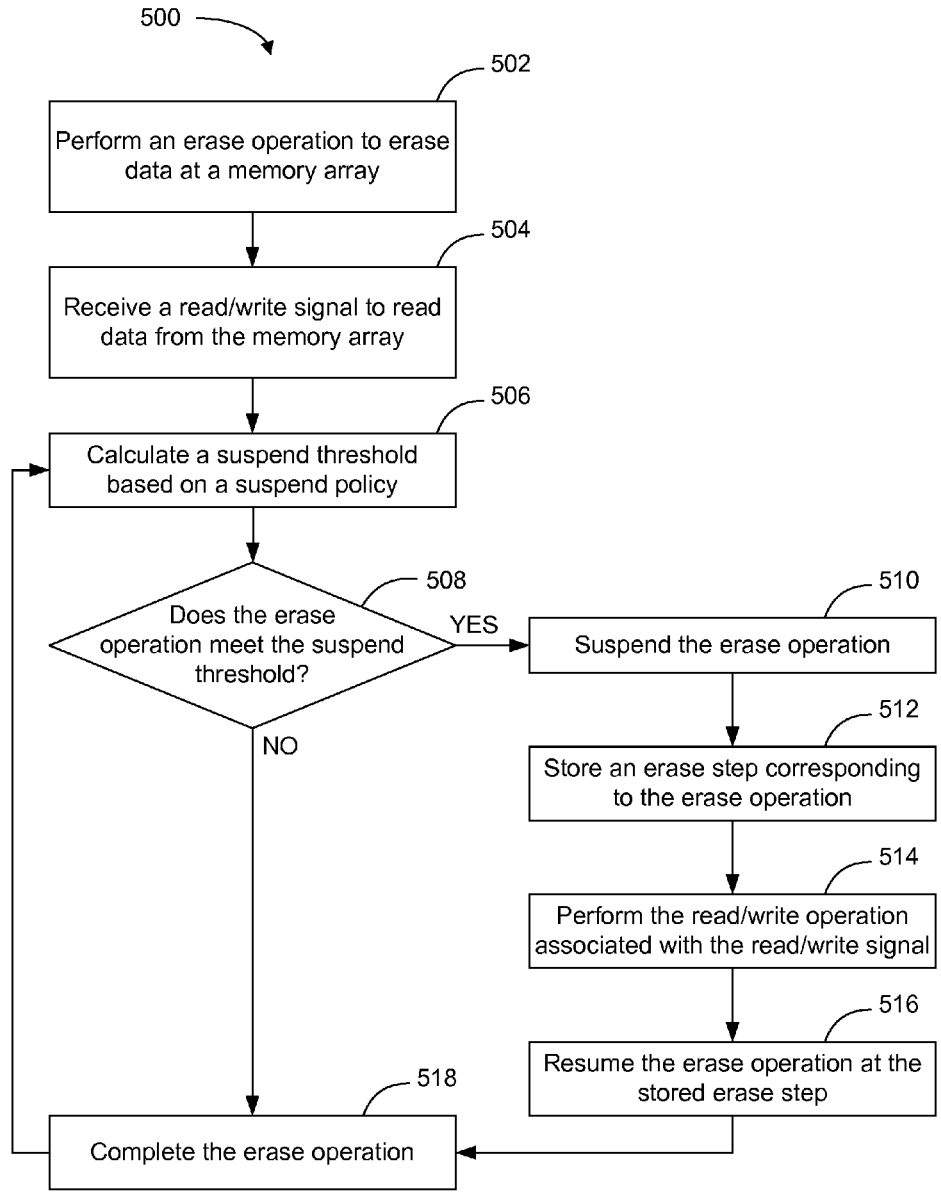
FIG. 5 depicts a flow chart diagram of one embodiment of a method for suspending an erase operation to the memory device of FIG. 2.

FIG. 5 depicts a flow chart diagram of one embodiment of a method 500 for suspending an erase operation at the memory device 116 of FIG. 2. Although the method 500 is shown and described with operations of the controller 114 and memory device 116 of FIG. 1, other embodiments of the method 500 may be implemented with other controllers and/or memory devices.

In one embodiment, the method 500 includes performing 502 a portion of an erase operation to erase data at the memory array. The erase operation includes erasing data stored in memory elements 126 of the memory device 116 corresponding to a specified block of addresses on the memory device 116. The block of memory elements 126 to be erased may be located on more than one memory array or memory chip.

When the memory device 116 receives 504 a read/write signal or other memory access request from the I/O interface 118 to read data from, write data to, or perform another operation at the memory array, the method 500 may include determining whether the address correspond to the read/write signal is located on the same chip as the erase operation. If the address corresponding to the read/write signal is located on the same chip as the current erase operation, the method 500 includes calculating 506 a suspend threshold based on a suspend policy.

The method 500 then determines 508 whether the erase operation meets the erase threshold. The suspend threshold may be used to determine whether to suspend the current erase operation in response to receiving the read/write signal or to wait until the erase operation is completed before performing the read/write operation for the read/write signal. If the erase operation does not meet the suspend threshold, the erase operation is completed 518 before performing the read/write operation. The suspend threshold may be used to balance read performance, program performance, and erase performance.

The suspend policy may include criteria related to the erase operation, the read/write operation, or other operations at the controller 114 or memory device 116. In one embodiment, the suspend policy includes suspending the erase operation automatically in response to receiving the read/write signal. In one embodiment, the suspend policy includes suspending the erase operation in response to determining that the erase operation is less than halfway completed. In one embodiment, the suspend policy includes a maximum number of times for suspending a single erase operation. In one embodiment, the suspend policy includes suspending the erase operation in response to determining that a benefit associated with suspending the erase operation is greater than a predetermined erase penalty value. The benefit is based on a remaining erase time for the erase operation. In one embodiment, the suspend policy includes increasing a probability of suspending the erase operation for each read/write signal in a queue of command signals. In one embodiment, the suspend policy includes decreasing the probability as the erase operation nears completion.

In another example, the suspend policy may include a read/write/erase sensitivity of an application requesting access to the memory device 116 for read/write/erase operations. If the application performs more erase operations than read/write operations, the threshold may be weighted to give more priority to erase operations. If the application performs more read/write operations than erase operations, the threshold may be weighted to give more priority to read/write operations. In another example, a write sensitive application that performs a high number of write operations may also perform a high number of erase operations before performing write operations if data is already stored at the memory elements 126. The threshold for such a write sensitive application may be weighted to give more priority to erase operations. Other embodiments may give different weights to erase and read/write operations based on the read/write/erase sensitivity. The suspend threshold may be based on probabilities or other criteria not described herein.

Once a determination has been made that the erase operation meets the suspend threshold, the erase operation is suspended 510 and any erase operations at the memory elements 126 may be stopped. In one embodiment, the method 500 includes storing 512 an erase step associated with the erase operation in response to suspending the erase operation. The addresses for the memory elements 126 associated with the erase operation are also stored with the erase step. The data associated with the erase operation may be stored at any location on the memory device 116 or at the controller, such as in a buffer or register.

After storing the data, the method 500 includes performing 514 the read/write (or other) operation associated with the read/write (or other memory access) signal. The read/write signal includes at least one address corresponding to a row and column for one or more memory elements 126 in the memory array. For a read operation, the data from the memory element 126 or memory elements 126 is read and copied to the I/O buffer 148 or read buffer 302. The data fetched from the memory array may then be sent on the I/O bus 150 to the controller 114. For a write operation, the data from the I/O bus 150 may be written to the I/O buffer 148 and then written to the corresponding memory elements 126 on the memory device 116. In one embodiment, a status register 158 at the memory device 116 is set to indicate that the read/write operation is completed.

The erase operation is then resumed 516 at the stored step count in response to receiving a resume signal from the controller 114 rather than starting the erase operation at the starting voltage. The resume signal indicates that the read/write operation is completed. If data corresponding to the erase step has been stored at a cache buffer 162 or other location in order to perform the read/write operation, the data corresponding to the erase step may be used to resume the erase operation at the stored erase step rather than starting the erase operation from the beginning. In another embodiment, the addresses corresponding to the erase operation may be stored and used to start the erase operation from the beginning. The erase operation may then be completed 518.

Several examples of pseudo code for the suspend policy are shown below.

Suspend on Receipt of Read/Write:

```
if(bank == erasing && incoming read/write)
    interrupt erase
    issue read/write
    continue erase
```

Suspend if Erase is Not More than Halfway Completed:

```
if(bank==erasing && incoming read)
    if(erasing done <= .5 * total erase time)
        interrupt erase
        issue read/write
        continue erase
```

Suspend if Maximum Interrupts has not Been Reached:

```
already_canceled=0
max_cancels=5
if(bank == erasing && incoming read/write)
    interrupt erase
        already_canceled++
    issue read/write
    continue erase
```

Suspend if Benefit is Greater than Penalty:

```
erase_cancel_penalty=1
erase_time=5
if(bank==erasing && incoming read/write)
    if(%erase time left * erase_time > erase_cancel_penalty)
        interrupt erase
        issue read/write
        continue erase
```

Increase Interrupt Probability with More Read/Write Operations, and Decrease Interrupt Probability as Erase Nears Completion:

```
magic_number=4
if(bank==erasing && incoming read/write)
    if(%erase time left / number_of_reads/writes queued > magic_number)
        interrupt erase
        issue read/write
        continue erase
```

The suspend policy may include one or more of the policies shown above. Alternatively, the suspend policy may include other criteria not described herein.

While many embodiments are described herein, some embodiments relate to an apparatus. The apparatus includes an input/output (I/O) interface configured to couple a controller to an I/O buffer of a memory device. The apparatus includes an erase module coupled to the I/O interface. The erase module is configured to issue an instruction to the memory device to erase data from the memory device. The electronic memory device controller includes an erase suspend module coupled to the I/O interface. The erase suspend module is configured to determine that an erase operation executing within the electronic memory device satisfies a suspend policy in response to receiving a memory access request to perform an operation at the memory device on which the erase operation is executing. The erase suspend module is configured to issue a suspend command to the memory device to suspend the erase operation.

Other embodiments described herein relate to a method for suspending an erase operation at a memory device. The method includes performing a portion of an erase operation including erasing data from a plurality of memory elements in a memory array of the memory device. The method includes receiving a memory access request to the memory device. The method includes calculating a suspend threshold based on a suspend policy. The method includes determining that the erase operation meets the suspend threshold. The method includes suspending the erase operation.

Other embodiments described herein relate to a memory device. The memory device includes a memory array with a plurality of memory elements. Each memory element is configured to store data. The memory device includes a memory control manager coupled to the memory array and to an input/output (I/O) interface of a memory device controller. The memory control manager is configured to calculate a suspend threshold associated with a predetermined suspend policy. The memory control manager is also configured to determine that an erase operation executing within the memory device meets the suspend threshold in response to receiving a memory access request from the I/O interface. The memory control manager is also configured to pause the erase operation.

Other embodiments described herein relate to a system. The system includes means for storing data in a plurality of memory elements in a memory device. The system includes means for erasing data from the memory elements. The system includes means for determining that an erase operation executing within the memory device satisfies a suspend policy in response to receiving a memory access request. The system includes means for suspending the erase operation.

An embodiment of the electronic memory device controller includes at least one processor coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Embodiments of the invention can take the form of an entirely hardware embodiment, an entirely software embodiment, or an embodiment containing both hardware and software elements. In one embodiment, the invention is implemented in software, which includes but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or memory devices through intervening private or public networks. Modems, cable modems, and Ethernet cards are just a few of the currently available types of network adapters.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus comprising:
    an input/output (I/O) interface configured to couple a controller to an I/O buffer of a memory device;
    an erase module coupled to the I/O interface, wherein the erase module is configured to issue an instruction to the memory device to erase data from the memory device; and
    an erase suspend module coupled to the I/O interface, the erase suspend module configured to determine that an erase operation executing within the memory device satisfies a suspend policy in response to receiving a memory access request to perform an operation on the memory device on which the erase operation is executing and to issue a suspend command to the memory device to suspend the erase operation, the suspend policy comprising one or more of suspending the erase operation in response to determining that the erase operation is less than halfway completed, suspending the erase operation up to a maximum number of times for suspending a single erase operation, and suspending the erase operation based on an expected rate of memory access requests to the memory device.

2. The apparatus of claim 1, wherein the suspend policy comprises suspending the erase operation automatically in response to receiving the memory access request.

3. The apparatus of claim 1, wherein the suspend policy comprises suspending the erase operation in response to determining that the erase operation is less than halfway completed.

4. The apparatus of claim 1, wherein the suspend policy comprises suspending the erase operation up to a maximum number of times for suspending a single erase operation.

5. The apparatus of claim 1, wherein the suspend policy comprises suspending the erase operation in response to determining that a benefit associated with suspending the erase operation is greater than a predetermined erase penalty value, wherein the benefit is based on a remaining erase time.

6. The apparatus of claim 1, wherein the suspend policy comprises suspending the erase operation based on an expected rate of memory access requests to the memory device.

7. The apparatus of claim 1, wherein the suspend policy comprises:
    increasing a probability of suspending the erase operation for each memory access request in a queue of access requests; and
    decreasing the probability as the erase operation nears completion.

8. The apparatus of claim 1, wherein the erase suspend module is further configured to:
    store an erase step associated with the erase operation in response to suspending the erase operation; and
    resume the erase operation at the erase step in response to completing an operation associated with the memory access request.

9. A method for suspending an erase operation at a memory device, the method comprising:
    performing a portion of an erase operation comprising erasing data from a plurality of memory elements in a memory array of the memory device;
    receiving a memory access request to the memory device;
    calculating a suspend threshold based on a predefined suspend policy determined for the memory device, the suspend policy comprising suspending the erase operation based on an expected rate of memory access requests to the memory device;
    determining that the erase operation meets the suspend threshold; and
    suspending the erase operation.

10. The method of claim 9, wherein the suspend policy comprises suspending the erase operation automatically in response to receiving the memory access request.

11. The method of claim 9, wherein the suspend policy comprises suspending the erase operation in response to determining that the erase operation is less than halfway completed.

12. The method of claim 9, wherein the suspend policy comprises a maximum number of times for suspending a single erase operation.

13. The method of claim 9, wherein the suspend policy comprises suspending the erase operation in response to determining that a benefit associated with suspending the erase operation is greater than a predetermined erase penalty value, wherein the benefit is based on a remaining erase time.

14. The method of claim 9, wherein the suspend policy comprises:
increasing a probability of suspending the erase operation for each memory access request in a queue of access requests; and
decreasing the probability as the erase operation nears completion.

15. The method of claim 9, further comprising:
storing an erase step associated with the erase operation in response to suspending the erase operation; and
resuming the erase operation at the erase step in response to completing an operation associated with the memory access request.

16. A memory device comprising:
a memory array with a plurality of memory elements, wherein each memory element is configured to store data;
a memory control manager coupled to the memory array and to an input/output (I/O) interface of a memory device controller, wherein the memory control manager is configured to:
determine that an erase operation executing within the memory device satisfies a suspend policy in response to receiving a memory access request from the I/O interface, the suspend policy comprising pausing the erase operation based on the erase operation being less than halfway completed; and
pause the erase operation.

17. The device of claim 16, wherein the suspend policy comprises pausing the erase operation automatically in response to receiving the memory access request.

18. The device of claim 16, wherein the suspend policy comprises pausing the erase operation up to a maximum number of times for suspending a single erase operation.

19. The device of claim 16, wherein the suspend policy comprises pausing the erase operation in response to determining that a benefit associated with suspending the erase operation is greater than a predetermined erase penalty value, wherein the benefit is based on a remaining erase time.

20. The device of claim 16, wherein the suspend policy comprises:
increasing a probability of pausing the erase operation for each read/write signal in a queue of command signals; and
decreasing the probability as the erase operation nears completion.

21. The device of claim 16, further comprising an erase register configured to store an erase step associated with the erase operation in response to pausing the erase operation, wherein the memory control manager is further configured to resume the erase operation at the erase step in response to completing an operation associated with the memory access request.

22. A system comprising:
a memory device comprising a plurality of memory elements;
means for storing data on the plurality of memory elements of the memory device;
means for erasing data from the memory elements;
means for determining that an erase operation executing within the memory device satisfies a suspend policy in response to receiving a memory access request, the suspend policy comprising suspending the erase operation up to a maximum number of times for suspending a single erase operation; and
means for suspending the erase operation.

23. The system of claim 22, further comprising:
means for storing an erase step associated with the erase operation in response to suspending the erase operation; and
means for resuming the erase operation at the erase step in response to completing a read/write operation associated with a read/write signal.

24. A memory device, comprising:
a memory array with a plurality of memory elements, wherein each memory element is configured to store data;
a memory control manager configured to be coupled to the memory array and to an input/output (I/O) interface of a memory device controller, wherein the memory control manager is configured to:
calculate a suspend threshold based on a suspend policy that comprises counts per erase block of the memory device of a number of times an erase block has been programmed and erased;
determine that an erase operation executing within the memory device meets the suspend threshold in response to receiving a memory access request from the I/O interface; and
pause the erase operation.

25. The memory device of claim 24, wherein the suspend policy further comprises decreasing a probability of suspending the erase operation as the erase operation nears completion.

26. The memory device of claim 24, wherein the suspend policy is based on the application accessing the memory device.

27. An apparatus comprising:
a memory controller, the memory controller comprising,
an input/output (I/O) interface configured to couple the memory controller to an I/O buffer of a memory device;
wherein the memory controller is configured to determine, in response to receiving a request to perform another operation on the memory device on which the erase operation is executing, whether an erase operation executing on the memory device satisfies a suspend policy; and
wherein the memory controller is configured to issue a suspend command to the memory device to suspend the erase operation in response to determining that the erase operation satisfies the suspend policy, the suspend policy comprising one or more of suspending the erase operation in response to determining that the erase operation is less than halfway completed, suspending the erase operation up to a maximum number of times for suspending a single erase operation, and suspending the erase operation based on an expected rate of memory access requests to the memory device.

28. The apparatus of claim 27, wherein the suspend policy comprises suspending the erase operation up to a maximum number of times for suspending a single erase operation.

29. The apparatus of claim 27, wherein the suspend policy comprises suspending the erase operation based on an expected rate of memory access requests to the memory device.

* * * * *